(12) United States Patent
Oikawa et al.

(10) Patent No.: US 10,897,007 B2
(45) Date of Patent: Jan. 19, 2021

(54) MAGNETIC MEMORY DEVICE

(71) Applicant: KABUSHIKI KAISHA TOSHIBA, Tokyo (JP)

(72) Inventors: Soichi Oikawa, Hachioji Tokyo (JP); Yushi Kato, Chofu Tokyo (JP); Hiroaki Yoda, Kawasaki Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 0 days.

(21) Appl. No.: 16/697,276

(22) Filed: Nov. 27, 2019

(65) Prior Publication Data
US 2020/0168790 A1 May 28, 2020

(30) Foreign Application Priority Data

Nov. 28, 2018 (JP) .................................. 2018-222119

(51) Int. Cl.
*G11C 11/16* (2006.01)
*H01L 43/02* (2006.01)
(Continued)

(52) U.S. Cl.
CPC ............ *H01L 43/02* (2013.01); *G11C 11/161* (2013.01); *G11C 11/1659* (2013.01);
(Continued)

(58) Field of Classification Search
CPC .......................... G11C 11/161; G11C 11/1675
(Continued)

(56) References Cited

U.S. PATENT DOCUMENTS 9,240,202 B1 * 1/2016 Kamiguchi .............. G11B 5/33
2009/0034135 A1 * 2/2009 Hoshiya ................ B82Y 10/00
360/324.12
(Continued)

FOREIGN PATENT DOCUMENTS

JP 2008-10590 A 1/2008
JP 2012-43967 A 3/2012
(Continued)

OTHER PUBLICATIONS

Honjo et al., "10 nm ⌀ perpendicular-anisotropy CoFeB-MgO magnetic tunnel junction with over 400°C. high thermal tolerance by boron diffusion control," 2015 Symposium on VLSI Technology Digest of Technical Papers, pp. T160-T161 (2015).

*Primary Examiner* — Michael T Tran
(74) *Attorney, Agent, or Firm* — Finnegan, Henderson, Farabow, Garrett & Dunner, L.L.P.

(57) ABSTRACT

According to one embodiment, a magnetic memory device includes a first magnetic region, a first counter magnetic region, and a first nonmagnetic region provided between the first magnetic region and the first counter magnetic region. The first magnetic region includes a first magnetic film, a second magnetic film, and an intermediate film. The first magnetic film is provided between the second magnetic film and the first nonmagnetic region. The intermediate film includes Ru and is provided between the first magnetic film and the second magnetic film. A distance along a first direction between the first magnetic film and the second magnetic film is not less than 1.8 nm and not more than 2.2 nm. The first direction is from the first counter magnetic region toward the first magnetic region.

20 Claims, 8 Drawing Sheets

(51) Int. Cl.
  *H01L 27/22* (2006.01)
  *H01L 43/10* (2006.01)
  *H01F 10/32* (2006.01)

(52) U.S. Cl.
  CPC ...... *G11C 11/1673* (2013.01); *G11C 11/1675* (2013.01); *H01F 10/3259* (2013.01); *H01L 27/228* (2013.01); *H01L 43/10* (2013.01); *H01F 10/329* (2013.01); *H01F 10/3286* (2013.01)

(58) Field of Classification Search
  USPC .................................................. 365/158, 171
  See application file for complete search history.

(56) References Cited

U.S. PATENT DOCUMENTS

| | | | | |
|---|---|---|---|---|
| 2010/0247965 | A1* | 9/2010 | Onoue | G11B 5/7325 428/800 |
| 2011/0244269 | A1* | 10/2011 | Kato | G11B 5/7325 428/828 |
| 2012/0018823 | A1* | 1/2012 | Huai | H01L 43/08 257/421 |
| 2012/0043631 | A1 | 2/2012 | Ohmori et al. | |
| 2013/0187248 | A1 | 7/2013 | Kariyada et al. | |
| 2015/0030886 | A1* | 1/2015 | Shirotori | G11B 5/3909 428/811.2 |
| 2015/0249205 | A1* | 9/2015 | Suwa | H01L 43/08 257/421 |
| 2016/0180906 | A1* | 6/2016 | Kudo | G11B 5/2654 365/158 |
| 2016/0380185 | A1* | 12/2016 | Kato | H01L 27/228 257/421 |
| 2017/0076769 | A1* | 3/2017 | Shirotori | H01L 43/02 |
| 2017/0212188 | A1* | 7/2017 | Kikitsu | G01R 33/025 |
| 2017/0363606 | A1* | 12/2017 | Kikitsu | H01L 43/08 |
| 2018/0174635 | A1 | 6/2018 | Yoda et al. | |
| 2018/0277744 | A1* | 9/2018 | Toko | H01L 43/12 |

FOREIGN PATENT DOCUMENTS

| | | |
|---|---|---|
| JP | 2013-149857 A | 8/2013 |
| JP | 2018-98468 A | 6/2018 |

* cited by examiner

MAGNETIC MEMORY DEVICE

CROSS-REFERENCE TO RELATED APPLICATIONS

This application is based upon and claims the benefit of priority from Japanese Patent Application No. 2018-222119, filed on Nov. 28, 2018; the entire contents of which are incorporated herein by reference.

FIELD

Embodiments described herein relate generally to a magnetic memory device.

BACKGROUND

Stable operations of a magnetic memory device are desirable.

DETAILED DESCRIPTION

Figure 1A:
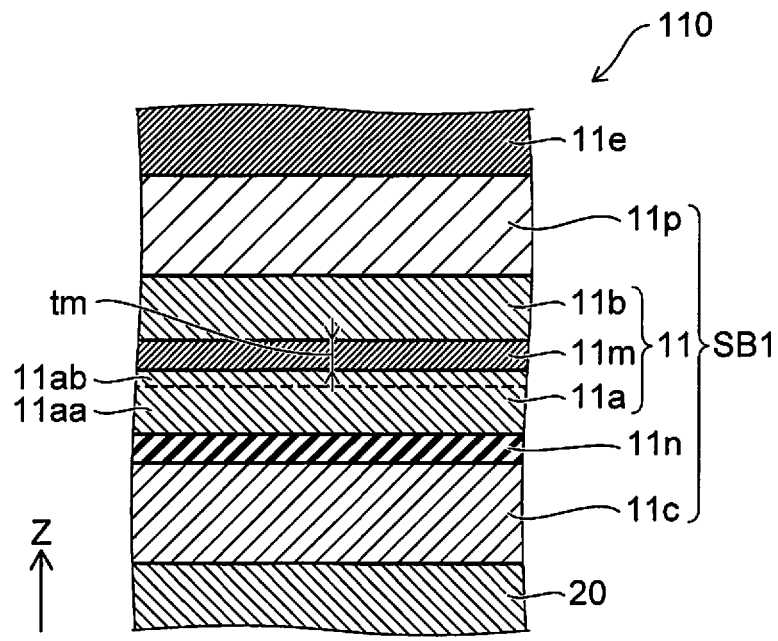
FIG. 1A and FIG. 1B are schematic views illustrating a magnetic memory device according to a first embodiment.

According to one embodiment, a magnetic memory device includes a first magnetic region, a first counter magnetic region, and a first nonmagnetic region provided between the first magnetic region and the first counter magnetic region. The first magnetic region includes a first magnetic film, a second magnetic film, and an intermediate film. The first magnetic film is provided between the second magnetic film and the first nonmagnetic region. The intermediate film includes Ru and is provided between the first magnetic film and the second magnetic film. A distance along a first direction between the first magnetic film and the second magnetic film is not less than 1.8 nm and not more than 2.2 nm. The first direction is from the first counter magnetic region toward the first magnetic region.

Various embodiments are described below with reference to the accompanying drawings.

The drawings are schematic and conceptual; and the relationships between the thickness and width of portions, the proportions of sizes among portions, etc., are not necessarily the same as the actual values. The dimensions and proportions may be illustrated differently among drawings, even for identical portions.

In the specification and drawings, components similar to those described previously or illustrated in an antecedent drawing are marked with like reference numerals, and a detailed description is omitted as appropriate.

First Embodiment

Figure 1B:
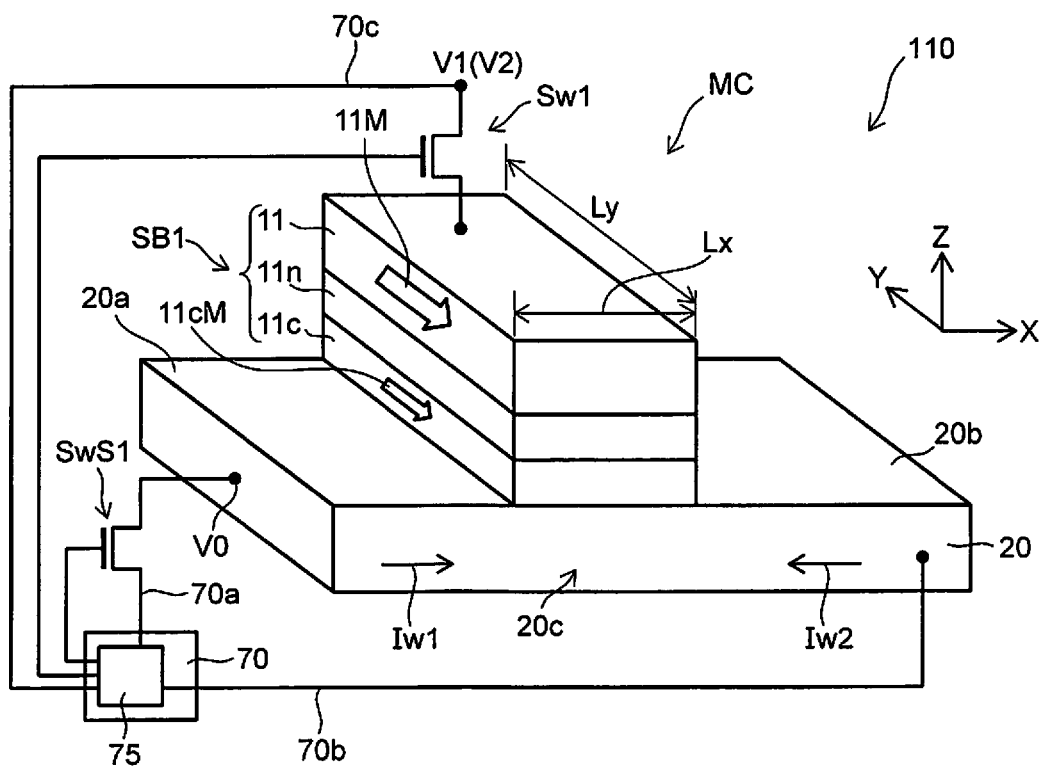

FIG. 1A and FIG. 1B are schematic views illustrating a magnetic memory device according to a first embodiment.

FIG. 1A is a cross-sectional view. FIG. 16 is a perspective view.

As shown in FIG. 1A and FIG. 1B, the magnetic memory device 110 includes a first magnetic region 11, a first counter magnetic region 11c, and a first nonmagnetic region 11n. In the example, the magnetic memory device 110 further includes a conductive member 20. As shown in FIG. 1B, the magnetic memory device 110 may further include a controller 70.

The first nonmagnetic region 11n is provided between the first magnetic region 11 and the first counter magnetic region 11c. As shown in FIG. 1A, the first magnetic region 11 includes a first magnetic film 11a, a second magnetic film 11b, and an intermediate film 11m. The first magnetic film 11a is provided between the second magnetic film 11b and the first nonmagnetic region 11n. The intermediate film 11m is provided between the first magnetic film 11a and the second magnetic film 11b. The intermediate film 11m includes Ru.

As shown in FIG. 1A, the direction (a first direction) from the first counter magnetic region 11c toward the first magnetic region 11 is taken as a Z-axis direction. As shown in FIG. 1B, one direction perpendicular to the Z-axis direction is taken as an X-axis direction. A direction perpendicular to the Z-axis direction and the X-axis direction is taken as a Y-axis direction.

For example, the first magnetic region 11, the first counter magnetic region 11c, and the first nonmagnetic region 11n include portions substantially parallel to the X-Y plane. For example, the first magnetic film 11a, the second magnetic film 11b, and the intermediate film 11m include portions substantially parallel to the X-Y plane. In the embodiment, the regions recited above may be curved with respect to the X-Y plane. In the embodiment, the films recited above may be curved with respect to the X-Y plane.

As shown in FIG. 1A, the distance along the first direction (e.g., the Z-axis direction) between the first magnetic film 11a and the second magnetic film 11b is taken as a distance tm. In the embodiment, the distance tm is, for example, not less than 1.8 nm and not more than 2.2 nm.

In one example, the intermediate film 11m contacts the first magnetic film 11a and contacts the second magnetic film 11b. In such a case, for example, the distance tm corresponds to the thickness along the Z-axis direction of the intermediate film 11m. As described below, another film (e.g., another region) may be provided between the intermediate film 11m and the first magnetic film 11a and/or between the intermediate film 11m and the second magnetic film 11b.

At least one of the first magnetic film 11a or the second magnetic film 11b includes at least one selected from the group consisting of Fe and Co. The first magnetic film 11a and the second magnetic film 11b include, for example, FeCo. For example, at least one of the first magnetic film 11a or the second magnetic film 11b may further include B. For example, the first magnetic film 11a and the second magnetic film 11b may include, for example, FeCoB.

In one example as shown in FIG. 1A, the first magnetic film 11a may include a first partial film 11aa, a second partial film 11ab, etc. The first partial film 11aa is provided between the second partial film 11ab and the first nonmagnetic region 11n. The first partial film 11aa includes, for example, CoFeB. The second partial film 11ab includes, for example, Co.

The first counter magnetic region 11c includes at least one selected from the group consisting of Fe and Co. The first counter magnetic region 11c may further include B.

The first nonmagnetic region 11n includes, for example, MgO, etc.

As shown in FIG. 1A, the magnetic memory device 110 may further include a magnetic portion 11p. The second magnetic film 11b is provided between the intermediate film 11m and the magnetic portion 11p. The magnetic portion 11p includes, for example, Mn. The magnetic portion 11p includes, for example, Mn and at least one selected from the group consisting of Ir and Pt. The magnetic portion 11p includes, for example, IrMn. The magnetic portion 11p is, for example, an antiferromagnetic body.

For example, the magnetic portion 11p contacts the second magnetic film 11b. For example, exchange coupling acts between the magnetic portion 11p and the second magnetic film 11b. For example, the magnetization of the second magnetic film 11b can be oriented in a designated direction by heat treatment in a magnetic field.

The first magnetic film 11a has antiferromagnetic interlayer coupling to the second magnetic film 11b. For example, by setting the distance tm recited above to an appropriate range, the first magnetic film 11a has antiferromagnetic (Synthetic Anti-Ferromagnetic) coupling to the second magnetic film 11b. The orientation of the magnetization of the first magnetic film 11a is substantially the reverse of the orientation of the magnetization of the second magnetic film 11b. Thus, for example, the first magnetic region 11 has an antiferromagnetically coupled configuration. For example, a leakage magnetic field is suppressed by the combination of the first magnetic film 11a and the second magnetic film 11b.

By such a configuration, the magnetization of the first magnetic region 11 is substantially stable in the storage operation of the magnetic memory device 110. The orientation of the magnetization of the first magnetic region 11 substantially does not change.

On the other hand, the orientation of the magnetization of the first counter magnetic region 11c changes more easily than the orientation of the magnetization of the first magnetic region 11. The first magnetic region 11 is, for example, a reference layer. The first counter magnetic region 11c is, for example, a memory layer (e.g., a free magnetic layer).

As shown in FIG. 1B, the first magnetic region 11, the first counter magnetic region 11c, and the first nonmagnetic region 11n are included in a first stacked body SB1. The first stacked body SB1 is, for example, a MTJ (Magnetic Tunnel Junction) element.

For example, the electrical resistance of the first stacked body SB1 changes due to an effect (a voltage, a current, or the like) from the outside. For example, the orientation of a magnetization 11cM of the first counter magnetic region 11c (referring to FIG. 1B) changes due to an effect from the outside. The angle between the orientation of the magnetization 11cM of the first counter magnetic region 11c and the orientation of the magnetization 11M of the first magnetic region 11 is changed thereby. Thereby, the electrical resistance of the first stacked body SB1 changes due to the effect from the outside. For example, multiple electrical resistance states are formed. The multiple electrical resistance states correspond to multiple information stored in the magnetic memory device 110. For example, a high resistance state corresponds to one of "0" or "1." For example, a low resistance state corresponds to the other of "0" or "1." The first stacked body SB1 is one magnetic element. In one example, the first stacked body SB1 corresponds to one memory cell MC.

For example, the state of the electrical resistance of the first stacked body SB1 can be detected via a conductive body electrically connected to the first stacked body SB1.

In the example as shown in FIG. 1A, the magnetic memory device 110 further includes the conductive member 20 and a conductive layer 11e. The first stacked body SB1 is provided between the conductive member 20 and the conductive layer 11e. The conductive layer 11e includes, for example, Ru, Ta, etc. The material of the conductive layer 11e is arbitrary. For example, the conductive member 20 and the conductive layer 11e are used in the read operation of the stored information.

The conductive member 20 may include, for example, at least one selected from the group consisting of Ta, W, Re, Os, Ir, Pt, Au, Cu, Ag, Hf, and Pd.

In one example, the magnetization 11cM of the first counter magnetic region 11c may be controlled by a current flowing in the conductive member 20. Thus, the conductive member 20 may be used in a write operation of information to the first stacked body SB1 (e.g., the memory cell MC).

An example of a storage operation of information in the first stacked body SB1 using the conductive member 20 will now be described.

As shown in FIG. 1B, the conductive member 20 includes a first portion 20a, a second portion 20b, and a third portion 20c. The third portion 20c is provided between the first portion 20a and the second portion 20b.

The first counter magnetic region 11c is provided between the third portion 20c and the first magnetic region 11 in the first direction. The first direction (the Z-axis direction) crosses a second direction. The second direction is the direction from the first portion 20a toward the second portion 20b. In the example, the second direction is the X-axis direction.

The first nonmagnetic region 11n is provided between the first magnetic region 11 and the first counter magnetic region 11c in the first direction (the Z-axis direction).

For example, the controller 70 is electrically connected to the first portion 20a and the second portion 20b. For example, the controller 70 includes a control circuit 75. For example, the control circuit 75 and the first portion 20a are electrically connected to each other by a first interconnect 70a. For example, the control circuit 75 and the second portion 20b are electrically connected to each other by a second interconnect 70b. For example, a switch SwS1 may be provided in a current path between the control circuit 75 and the conductive member 20. The switch SwS1 may be included in the controller 70.

For example, the controller 70 performs a first operation and a second operation. In the first operation, the controller 70 supplies a first current Iw1 to the conductive member 20 from the first portion 20a toward the second portion 20b. In the second operation, the controller 70 supplies a second current Iw2 to the conductive member 20 from the second portion 20b toward the first portion 20a.

By such operations, different electrical resistances are obtained in the first stacked body SB1. For example, the change of the electrical resistance corresponds to the change of the resistance between the first magnetic region 11 and the first counter magnetic region 11c. For example, the change of the electrical resistance may correspond to the change of the resistance between the first magnetic region 11 and one of the first portion 20a or the second portion 20b. For example, the change of the electrical resistance may correspond to the electrical resistance between the first magnetic region 11 and the conductive member 20.

For example, a first electrical resistance when the first current Iw1 flows is different from a second electrical resistance when the second current Iw2 flows.

For example, the magnetization 11cM of the first counter magnetic region 11c is controlled to one orientation by the first current Iw1. For example, the magnetization 11cM of the first counter magnetic region 11c is controlled to another orientation by the second current Iw2. The control of the orientation of the magnetization 11cM is based on a magnetic effect (e.g., a spin Hall effect, etc.). Thus, the orientation of the magnetization 11cM is controlled to multiple different orientations. Mutually-different multiple electrical resistances are obtained thereby.

For example, the control circuit 75 of the controller 70 may be electrically connected to the first magnetic region 11. For example, the electrical connection is performed via the conductive layer 11e. A switch Sw1 may be provided in a path (e.g., the interconnect 70c) between the control circuit 75 and the first magnetic region 11. For example, the electrical resistance of the first stacked body SB1 may be detected by the controller 70. For example, the select or the unselect of the first stacked body SB1 may be controlled by the controller 70 controlling the potential of the first magnetic region 11.

In the manufacturing processes of the magnetic memory device, after making a first stacked body SB1 such as that recited above, processes (e.g., BEOL processes: Back End of Line) are performed to connect the first stacked body SB1 to various circuits. In these processes, for example, a high temperature of 400° C. or the like is applied to the first stacked body SB1. It was found that due to such a high temperature, there are cases where the desired characteristics of the magnetic memory device are difficult to obtain. For example, it was found that due to a high temperature of 400° C. or the like, there are cases where the desired state changes (e.g., breaks down) in the first magnetic region 11. When the desired state changes in the first magnetic region 11, the antiferromagnetic coupling of the first magnetic region 11 becomes unstable; as a result, it is difficult to obtain the desired electrical resistance change.

According to experiments of the inventor, it was found that the change of the desired state after a high-temperature processing at 400° C. or the like can be suppressed by setting the distance tm of the first magnetic region 11 (FIG. 1A) to be, for example, not less than 1.8 nm and not more than 2.2 nm.

The experiment results will now be described. In the experiments, samples are made in which the first counter magnetic region 11c is not provided. In the samples, a Ta film (having a thickness of 5 nm), a TaB film (having a thickness of 3 nm), a MgO film (having a thickness of 1.6 nm), a CoFeB film (having a thickness of 1.3 nm), a Co film (having a thickness of 0.7 nm), a Ru film, a $Co_{50}Fe_{50}$ film (having a thickness of 2 nm), and a Ta film (having a thickness of 3 nm) are provided in order on a base body (a $SiO_2$ substrate).

For example, the MgO film corresponds to the first nonmagnetic region 11n. For example, the CoFeB film corresponds to the first partial film 11aa (referring to FIG. 1A). The Co film corresponds to the second partial film 11ab (referring to FIG. 1A). The first partial film 11aa and the second partial film 11ab correspond to the first magnetic film 11a. The Ru film corresponds to the intermediate film 11m. The $Co_{50}Fe_{50}$ film corresponds to the second magnetic film 11b. In a sample having such a configuration, the thickness of the Ru film corresponds to the distance tm shown in FIG. 1A. Heat treatment at 300° C., 350° C., or 400° C. is performed for samples in which the thickness of the Ru film is modified. The time of the heat treatment is 1 hour. An exchange coupling field Hex between the first magnetic film 11a and the second magnetic film 11b is evaluated for the samples after the heat treatment.

Figure 2A:
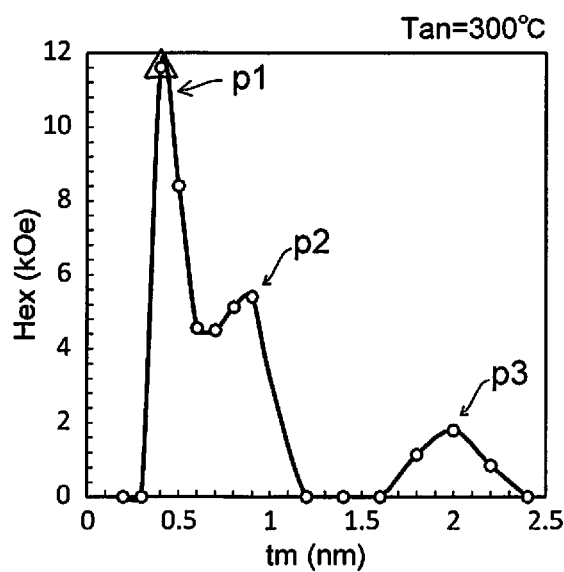
FIG. 2A to FIG. 2C are graphs illustrating the experiment results.
Figure 2B:
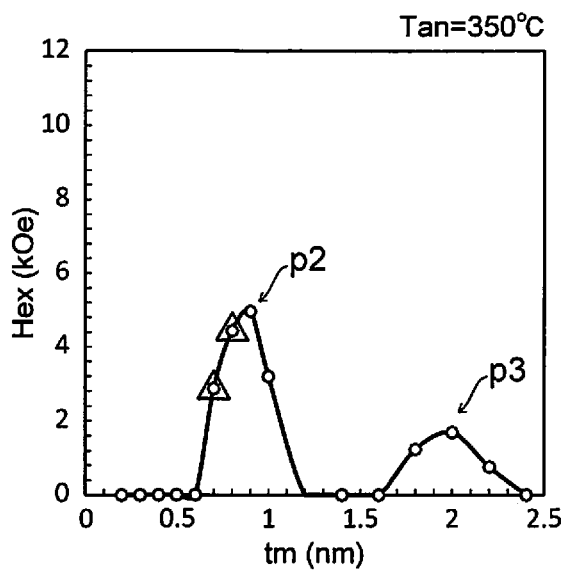
Figure 2C:
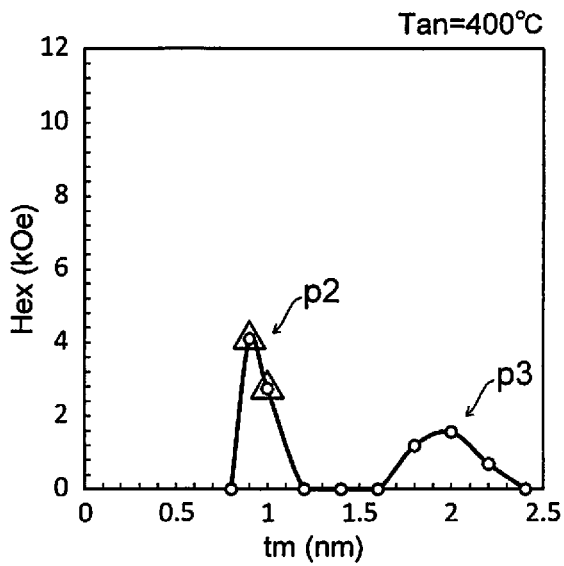

FIG. 2A to FIG. 2C are graphs illustrating the experiment results.

FIG. 2A corresponds to the sample of the heat treatment of 300° C. FIG. 2B corresponds to the sample of the heat treatment of 350° C. FIG. 2C corresponds to the sample of the heat treatment of 400° C. In these figures, the horizontal axis is the distance tm (nm). The distance tm corresponds to the thickness of the Ru film. The vertical axis is the exchange coupling field Hex (kOe).

As shown in FIG. 2A, three peaks are observed when a temperature Tan of the heat treatment is 300° C. The exchange coupling field Hex is extremely high at the peak (a first peak p1) where the distance tm is about 0.4 nm. The exchange coupling field Hex at the peak (a second peak p2) where the distance tm is about 0.84 nm is lower than that of the first peak p1. The exchange coupling field Hex at the peak (a third peak p3) where the distance tm is about 2 nm is lower than that of the second peak p2.

It is considered that the first peak p1 corresponds to the first peak of RKKY (Ruderman-Kittel-Kasuya-Yosida) coupling. It is considered that the second peak p2 corresponds to the second peak of RKKY coupling. It is considered that the third peak p3 corresponds to the third peak of RKKY coupling.

The triangular symbol shown in FIG. 2A shows that residual magnetization is observed clearly. The residual magnetization does not occur if the entire magnetic film is antiferromagnetically coupled. The conditions that correspond to the triangular symbol are not practical because the antiferromagnetic coupling is insufficient. Therefore, it is favorable not to employ the first peak p1. On the other hand, the exchange coupling field Hex at the third peak p3 is lower than the exchange coupling field Hex at the second peak p2. Therefore, it is considered that it is favorable to employ the conditions of the second peak p2 (e.g., the distance tm of about 0.84 nm) for the heat treatment of 300° C.

When the temperature Tan of the heat treatment is 350° C. as shown in FIG. 2B, the first peak p1 is not observed; and the second peak p2 and the third peak p3 are observed. As in the triangular symbols shown in FIG. 2B, the distance tm is not practical at 0.6 nm to 0.7 nm because residual magnetization is observed clearly. Conversely, the third peak p3 of FIG. 2B is substantially the same as the third peak p3 of FIG. 2A.

When the temperature Tan of the heat treatment is 400° C. as shown in FIG. 2C, the first peak p1 is not observed; and the second peak p2 and the third peak p3 are observed. As in the triangular symbols shown in FIG. 2C, the distance tm is not practical at 0.84 nm to 1 nm because residual magnetization is observed clearly. Conversely, the third peak p3 of FIG. 2C is substantially the same as the third peaks p3 of FIG. 2A and FIG. 2B.

Thus, it was found that the characteristics of the third peak p3 substantially do not change even when the temperature Tan of the heat treatment increases from 300° C. to 400° C.

Therefore, it was found that stable characteristics are obtained even for heat treatment at high temperatures by setting the distance tm at the vicinity of the third peak p3. For example, the diffusion of elements included in the various layers occurs easily due to heat treatment at high temperatures such as 400° C., etc. For example, there is a possibility that the thickness of the Ru film used to form the intermediate film 11m may become nonuniform due to the heat treatment at high temperatures such as 400° C., etc. The tolerance of the fluctuation of the thickness of the Ru film is wide at the third peak p3. By employing the conditions of the third peak p3, the characteristics of the antiferromagnetic coupling are not affected by the nonuniformity of the thickness of the Ru occurring due to the heat treatment at high temperatures.

In the embodiment, the distance tm is, for example, not less than 1.8 nm and not more than 2.2 nm. Thereby, stable characteristics are obtained even for the heat treatment at high temperatures. According to the embodiment, high heat resistance is obtained. A magnetic memory device is obtained in which stable operations are possible.

In the embodiment, the distance tm is, for example, 2.0 nm±0.2 nm. For example, the thickness of the intermediate film 11m is, for example, 2.0 nm±0.2 nm.

As shown in FIG. 2A, the height of the first peak p1 is higher than the height of the third peak p3. The height of the second peak p2 is higher than the height of the third peak p3. Moreover, the change of the height of the peak with respect to the change of the distance tm is large at the first peak p1. Based on these considerations, the conditions of the second peak p2 generally are employed if it is unnecessary to consider the temperature Tan of the heat treatment. Because the height of the third peak p3 is relatively low, the conditions of the third peak p3 are not employed if it is unnecessary to consider the temperature Tan of the heat treatment.

Conversely, according to the experiments of the inventor as shown in FIG. 2A to FIG. 2C, the characteristics of the third peak p3 are stable for the heat treatment. In the embodiment, a magnetic memory device that has a high resistance to high temperatures can be provided by employing the conditions of the third peak p3 which generally are not employed.

Another CoFeB film is further provided in the configuration (the Ta film, the TaB film, the MgO film, the CoFeB film, the Co film, the Ru film, and the $Co_{50}Fe_{50}$ film) of the samples described above. The other CoFeB film is provided between the TaB film and the MgO film. An IrMn film (having a thickness of 8 nm), a Ta film (having a thickness of 5 nm), and a Ru film (having a thickness of 7 nm) are further provided on the $Co_{50}Fe_{50}$ film. By changing the external magnetic field and measuring the state of the magnetization of the magnetic layer for this sample, the degree of the fixation of the magnetization can be evaluated for the first magnetic film 11a and the second magnetic film 11b. For example, the condition of the distance tm of 0.8 nm to 1 nm corresponds to the second peak p2. In this sample, the magnetizations of the two magnetic films are fixed to be strongly antiparallel when the temperature Tan of the heat treatment is 300° C. The fixation of the magnetizations of the two magnetic films weakens when the temperature Tan of the heat treatment increases to 350° C. When the temperature Tan of the heat treatment increases further to 400° C., the fixation of the magnetization weakens; and the magnetizations of the two magnetic films become substantially parallel.

On the other hand, the condition of the distance tm of 2.0 nm±0.2 nm corresponds to the third peak p3. In this sample, the magnetizations of the two magnetic films are maintained to be antiparallel even when the temperature Tan of the heat treatment is 400° C.

In the embodiment as shown in FIG. 1B, the easy magnetization axes of the first magnetic region 11 and the first counter magnetic region 11c are along the X-Y plane. For example, at least one of the easy magnetization axis of the first magnetic film 11a or the easy magnetization axis of the second magnetic film 11b crosses, for example, the first direction (the Z-axis direction). For example, the angle between the first direction (the Z-axis direction) and the easy magnetization axis of the first magnetic film 11a is, for example, 60 degrees or more. For example, the angle between the first direction (the Z-axis direction) and the easy magnetization axis of the second magnetic film 11b is, for example, 60 degrees or more.

On the other hand, it is reported that stable antiferromagnetic coupling in a MTJ element including a perpendicular magnetization film is obtained even for heat treatment at about 400° C. when the thickness of the Ru film is about 0.4 nm or about 0.9 nm. It is unnecessary to use a thick Ru film in a MTJ element including a perpendicular magnetization film.

Conversely, for a MTJ element including an in-plane magnetization film, it was found that the antiferromagnetic coupling becomes unstable at high temperatures such as 400° C. Also, it was found that the stability of the antiferromagnetic coupling is increased by lengthening the distance tm corresponding to the thickness of the Ru film.

There is a possibility that differences such as the difference between the perpendicular magnetization film and the in-plane magnetization film recited above have a relationship to the material of the magnetization film and the crystal structure due to the material of the magnetic film. In the embodiment, at least one of the first magnetic film 11a or the second magnetic film 11b includes a body-centered cubic structure or an amorphous structure.

As described above, at least one of the first magnetic film 11a or the second magnetic film 11b includes at least one selected from the group consisting of Fe and Co. It is considered that the temperature dependence described in reference to FIG. 2A to FIG. 2C occurs easily in such magnetic films.

Examples of the element profiles of the first stacked body SB1 according to the embodiment will now be described.

FIG. 3A to FIG. 3D are graphs illustrating characteristics of the magnetic memory device according to the first embodiment.

These figures illustrate the element profiles of the magnetic memory device 110 according to the embodiment. In these figures, the horizontal axis corresponds to a position pZ (nm) in the Z-axis direction. The vertical axis corresponds to an element concentration C1 (atom %). These figures are obtained by energy dispersive X-ray spectrometry (EDX).

In the samples, a Ta film (having a thickness of 5 nm), a TaB film (having a thickness of 3 nm), a CoFeB film (having a thickness of 1.6 nm), a MgO film (having a thickness of 1.6 nm), a CoFeB film (having a thickness of 1.2 nm), a Co film (having a thickness of 0.6 nm), a Ru film (having a thickness of 2.0 nm), a $Co_{50}Fe_{50}$ film (having a thickness of 1.8 nm), an IrMn film (having a thickness of 8 nm), a Ta film (having a thickness of 5 nm), and a Ru film (having a thickness of 7 nm) are provided in order on a base body (a $SiO_2$ substrate).

The Ta film (having a thickness of 5 nm) and the TaB film (having a thickness of 3 nm) correspond to the conductive member 20. The CoFeB film corresponds to the first counter magnetic region 11c. For example, the MgO film corresponds to the first nonmagnetic region 11n. For example, the CoFeB film corresponds to the first partial film 11aa (referring to FIG. 1A). The Co film corresponds to the second partial film 11ab (referring to FIG. 1A). The first partial film 11aa and the second partial film 11ab correspond to the first magnetic film 11a. The Ru film corresponds to the intermediate film 11m. The $Co_{50}Fe_{50}$ film corresponds to the second magnetic film 11b. The IrMn film corresponds to the magnetic portion 11p. The Ta film and the Ru film correspond to the conductive layer 11e.

Heat treatment at 300° C., 350° C., or 400° C. is performed for such samples. The time of the heat treatment is 1 hour.

Figure 3A:
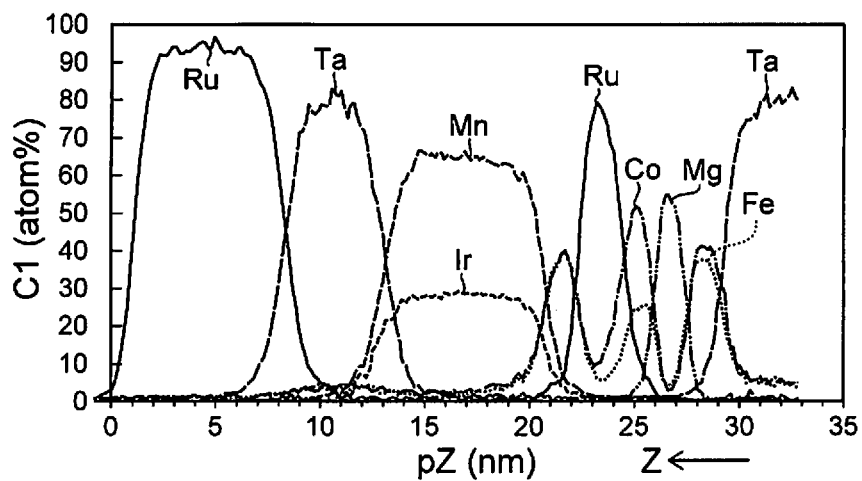
FIG. 3A to FIG. 3D are graphs illustrating characteristics of the magnetic memory device according to the first embodiment.
Figure 3B:
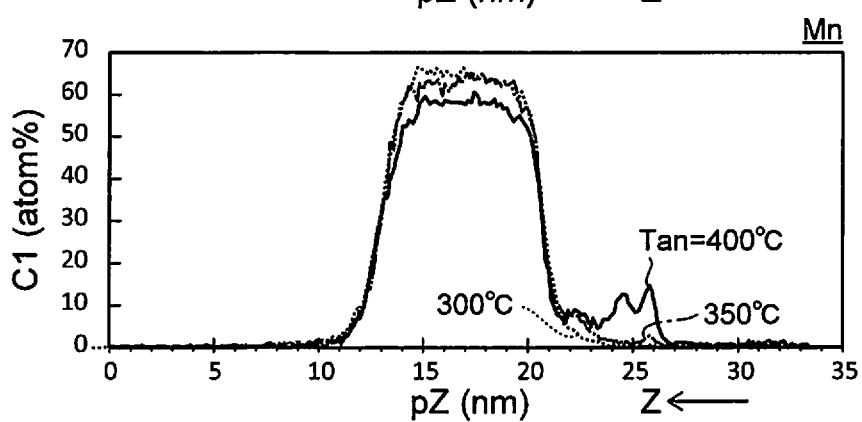
Figure 3C:
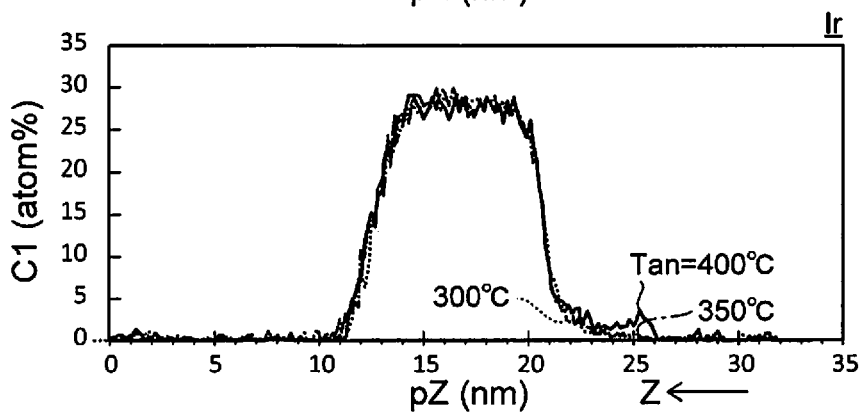
Figure 3D:
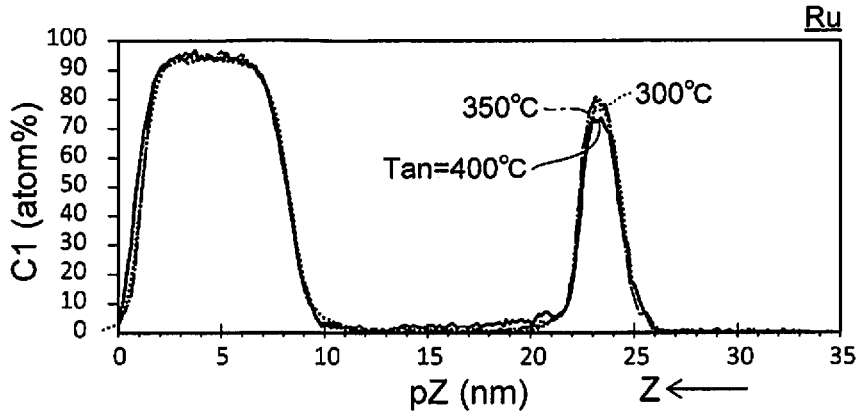

FIG. 3A corresponds to the sample after heat treatment at 300° C. is performed. The concentration C1 profiles of Ru, Ta, Mn, Ir, Fe, Co, and Mg each are shown in FIG. 3A. FIG. 3B to FIG. 3D show a portion of the element profiles when the temperature Tan of the heat treatment is 300° C., 350° C., and 400° C. FIG. 3B corresponds to Mn. FIG. 3C corresponds to Ir. FIG. 3D corresponds to Ru.

As shown in FIG. 3A and FIG. 3D, a peak of Ru is observed at the position where the position pZ is about 23 nm. This position corresponds to the intermediate film 11m. As shown in FIG. 3A, a peak of Co is observed at the position where the position pZ is about 25 nm. This position corresponds to the first magnetic film 11a. As shown in FIG. 3A, another peak of Co is observed at the position where the position pZ is about 21 nm. This position corresponds to the second magnetic film 11b.

As shown in FIG. 3A, the concentrations C1 of Mn and Ir are high in the range where the position pZ is about 14 nm to about 20 nm. This region corresponds to the magnetic portion 11p.

As shown in FIG. 3B, the concentration C1 of Mn is low in the range where the position pZ is about 23 nm to about 26 nm when the temperature Tan of the heat treatment is 300° C. The concentration C1 of Mn in this range increases slightly when the temperature Tan of the heat treatment is 350° C. The concentration C1 of Mn in this range increases clearly when the temperature Tan of the heat treatment is 400° C.

It is considered that the increase of the concentration C1 of Mn in the range of the position pZ about 23 nm to about 26 nm when the temperature Tan of the heat treatment is 400° C. is due to the Mn included in the magnetic portion 11p moving into the first magnetic film 11a, etc., due to the heat treatment.

As shown in FIG. 3C, the concentration C1 of Ir is low in the range where the position pZ is about 23 nm to about 26 nm when the temperature Tan of the heat treatment is 300° C. and 350° C. The concentration C1 of Ir in this range increases when the temperature Tan of the heat treatment is 400° C.

It is considered that the increase of the concentration C1 of Ir in the range where the position pZ is about 23 nm to about 26 nm when the temperature Tan of the heat treatment is 400° C. is due to the Ir included in the magnetic portion 11p moving into the first magnetic film 11a, etc., due to the heat treatment.

The magnetic memory device 110 according to the embodiment is processed at high temperatures such as 400° C. or the like. In the magnetic memory device 110, the first magnetic film 11a includes Mn (referring to FIG. 3B). In the magnetic memory device 110, the intermediate film 11m may include Mn. Also, the second magnetic film 11b may include Mn.

As shown in FIG. 3B, the concentration C1 of Mn in the first magnetic film 11a (the position where the position pZ is about 24 nm to about 26 nm) is 10 atomic % or more. On the other hand, the concentration of Mn in the magnetic portion 11p (the range where the position pZ is about 14 nm to about 20 nm) is about 60 atomic %. In the embodiment, for example, in energy dispersive X-ray spectrometry, the concentration C1 (e.g., the maximum value) of Mn in the first magnetic film 11a is not less than 0.1 times the concentration C1 (e.g., the maximum value) of Mn in the magnetic portion 11p.

As shown in FIG. 3B, the concentration C1 of Mn in the intermediate film 11m (the position where the position pZ is about 23 nm to about 24 nm) is 7 atomic % or more. The concentration of Mn in the magnetic portion 11p is about 60 atomic %. In the embodiment, for example, in energy dispersive X-ray spectrometry, the concentration C1 (e.g., the maximum value) of Mn in the intermediate film 11m is not less than 0.1 times the concentration C1 (e.g., the maximum value) of Mn in the magnetic portion 11p.

As shown in FIG. 3B, the concentration C1 of Mn in the second magnetic film 11b (the position where the position pZ is about 22 nm to about 23 nm) is 6 atomic % or more. The concentration of Mn in the magnetic portion 11p is about 60 atomic %. In the embodiment, for example, in energy dispersive X-ray spectrometry, the concentration C1 (e.g., the maximum value) of Mn in the second magnetic film 11b is not less than 0.1 times the concentration C1 (e.g., the maximum value) of Mn in the magnetic portion 11p.

In the embodiment, the elements (e.g., Mn, etc.) that are included in the magnetic portion 11p may move into the first magnetic region 11 due to the heat treatment of the manufacturing processes, etc. For example, an amorphous region may be provided in at least a portion of the first magnetic film 11a and the second magnetic film 11b.

Thus, the first magnetic region 11 may include a region including Mn. For example, the damping of the first magnetic region 11 may be strengthened by the region including Mn. For example, in a read operation, there are cases where the magnetization 11M of the first magnetic region 11 fluctuates due to the reaction of the spin torque. The fluctuation of the magnetization 11M is suppressed by the strengthening of the damping by the region including Mn. More stable operations are obtained.

Figure 4:
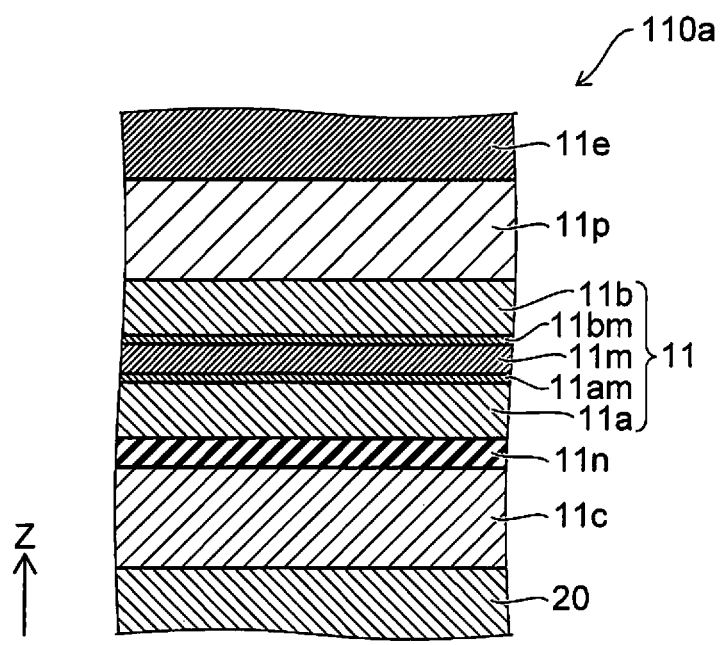
FIG. 4 is a schematic cross-sectional view illustrating a magnetic memory device according to the first embodiment.

FIG. 4 is a schematic cross-sectional view illustrating a magnetic memory device according to the first embodiment.

As shown in FIG. 4, the first magnetic region 11 may include at least one of a first film 11am or a second film 11bm. The first film 11am is provided between the first magnetic film 11a and the intermediate film 11m. The second film 11bm is provided between the second magnetic film 11b and the intermediate film 11m.

At least one of the first film 11am or the second film 11bm includes at least one selected from the group consisting of Ir, W, Ta, Mo, and B. At least one of the first film 11am or the second film 11bm may include oxygen.

For example, the movement of the elements (e.g., the Mn, etc.) included in the magnetic portion 11p into the intermediate film 11m, etc., may be suppressed by the second film 11bm.

For example, the movement of the elements (e.g., the Mn, etc.) included in the magnetic portion 11p into the first magnetic film 11a, etc., may be suppressed by the first film 11am.

In the embodiment as shown in FIG. 1B, the length of the first magnetic region 11 along the second direction (the X-axis direction) crossing the first direction (the Z-axis direction) is taken as a length Lx. The length Lx is, for example, not less than 10 nm and not more than 100 nm. The length along a third direction of the first magnetic region 11 is taken as a length Ly. The length Ly is, for example, not less than 10 nm and not more than 200 nm. The third direction crosses a plane including the first direction and the second direction. The third direction is, for example, the Y-axis direction.

These lengths correspond to the size of the first stacked body SB1 (the magnetic element). By downscaling the magnetic element, the antiparallel stability is increased by the magnetostatic energy at the central portion of the magnetic element. For example, when the length Lx is not less than 10 nm and not more than 30 nm and the length Ly is not less than 10 nm and not more than 50 nm, stable operations are obtained easily even for a low exchange coupling field Hex by, for example, increasing the antiparallel stability.

In the embodiment, the length Ly may be longer than the length Lx. For example, due to the shape anisotropy, the magnetization 11M of the first magnetic region 11 easily is fixed to the desired orientation.

In the embodiment, the controller 70 may perform at least the following first operation and second operation. As described above, the controller 70 is electrically connected to the first portion 20a and the second portion 20b (referring to FIG. 1B). In the first operation, the controller 70 supplies the first current Iw1 to the conductive member 20 from the first portion 20a toward the second portion 20b. In the second operation, the controller 70 supplies the second current Iw2 to the conductive member 20 from the second portion 20b toward the first portion 20a.

As described above, the controller 70 may be electrically connected also to the first magnetic region 11. The controller 70 may further perform a third operation and a fourth operation described below. In the first operation recited above, the controller 70 sets the potential difference between the first portion 20a and the first magnetic region 11 to a first voltage V1 (referring to FIG. 1B). In the second operation recited above, the controller 70 sets the potential difference between the first portion 20a and the first magnetic region 11 to the first voltage V1. The voltage is, for example, a voltage referenced to a potential V0 of the first portion 20a.

In the third operation, the controller 70 sets the potential difference between the first portion 20a and the first magnetic region 11 to a second voltage V2 (referring to FIG. 1B) and supplies the first current Iw1 to the conductive member 20. In the fourth operation, the controller 70 sets the potential difference between the first portion 20a and the first magnetic region 11 to the second voltage V2 and supplies the second current Iw2 to the conductive member 20.

The first voltage V1 is different from the second voltage V2. The first electrical resistance between the first magnetic region 11 and the first portion 20a after the first operation is different from the second electrical resistance between the first magnetic region 11 and the first portion 20a after the second operation. The first voltage V1 is, for example, a select potential.

For example, a third electrical resistance between the first magnetic region 11 and the first portion 20a after the third operation is substantially the same as the electrical resistance before the third operation. For example, a fourth electrical resistance between the first magnetic region 11 and the first portion 20a after the fourth operation is substantially the same as the electrical resistance before the fourth operation. The second voltage V2 is, for example, an unselect potential.

For example, the absolute value of the difference between the first electrical resistance and the second electrical resistance is greater than the absolute value of the difference between the third electrical resistance between the first magnetic region 11 and the first portion 20a after the third operation and the fourth electrical resistance between the first magnetic region 11 and the first portion 20a after the fourth operation.

The rewriting (e.g., the writing) of information is performed by the first operation and the second operation. The rewriting (e.g., the writing) of information is not performed by the third operation and the fourth operation.

Second Embodiment

Portions similar to those of the first embodiment are omitted as appropriate in the following description.

Figure 5:
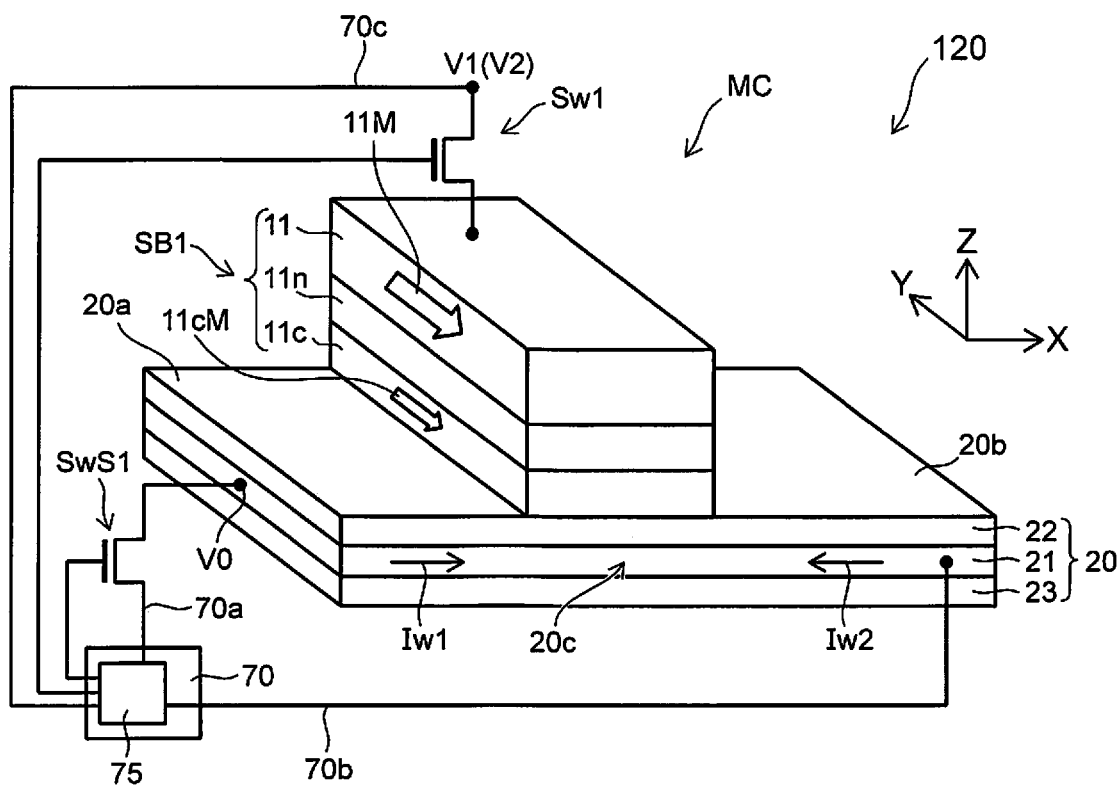
FIG. 5 is a schematic perspective view illustrating a magnetic memory device according to the second embodiment.

FIG. 5 is a schematic perspective view illustrating a magnetic memory device according to the second embodiment.

As shown in FIG. 5, the magnetic memory device 120 includes the conductive member 20, the first magnetic region 11, the first counter magnetic region 11c, and the first nonmagnetic region 11n. The magnetic memory device 120 may further include the controller 70.

The conductive member 20 includes the first portion 20a, the second portion 20b, and the third portion 20c. The third portion 20c is provided between the first portion 20a and the second portion 20b. The first counter magnetic region 11c is provided between the third portion 20c and the first magnetic region 11 in the first direction. The first direction crosses the second direction. The second direction is the direction from the first portion 20a toward the second portion 20b. In the example, the second direction is the X-axis direction.

The third portion 20c includes a first conductive region 21, a second conductive region 22, and a third conductive region 23. The first counter magnetic region 11c is provided between the first nonmagnetic region 11n and the third conductive region 23 in the Z-axis direction. The second conductive region 22 is provided between the first counter magnetic region 11c and the third conductive region 23 in the Z-axis direction. The first conductive region 21 is provided between the second conductive region 22 and the third conductive region 23 in the Z-axis direction.

The first conductive region 21 includes a first metal. The first metal includes, for example, at least one selected from the group consisting of Hf, Ta, W, Re, Os, Ir, Pt, Au, Bi, Cu, Ag, and Pd.

The second conductive region 22 includes a second metal and boron. In one example, the second metal includes at least one selected from the group consisting of Hf, Ta, W, Re, Os, Ir, Pt, Au, Bi, Cu, Ag, and Pd. The first conductive region 21 does not include boron. Or, the concentration (a first concentration) of boron in the first conductive region 21 is lower than the concentration (a second concentration) of boron in the second conductive region 22. The second metal may be the same as the first metal.

The third conductive region 23 includes a third metal and boron. In one example, the third metal includes at least one selected from the group consisting of Hf, Ta, W, Re, Os, Ir, Pt, Au, Bi, Cu, Ag, and Pd. The first conductive region 21 does not include boron. Or, the concentration (the first concentration) of boron in the first conductive region 21 is lower than the concentration (a third concentration) of boron in the third conductive region 23. The third metal may be the same as the first metal. The third metal may be the same as the second metal.

As described below, good writing characteristics are obtained by such a conductive member 20.

First to sixth samples are made in the experiment described below. In the first to sixth samples, the conductive member 20, the first counter magnetic region 11c, the first nonmagnetic region 11n, and the first magnetic region 11 are provided in this order on a base body. The first nonmagnetic region 11n is a MgO film (having a thickness of 1.6 nm). The first magnetic region 11 includes the first magnetic film 11a, the intermediate film 11m, and the second magnetic film 11b. The first magnetic film 11a is a $Co_{40}Fe_{40}B_{20}$ film (having a thickness of 1.8 nm). The intermediate film 11m is a Ru film (having a thickness of 0.8 nm). The second magnetic film 11b is a $Co_{50}Fe_{50}$ film (having a thickness of 1.8 nm).

In the first to fourth samples, the first to third conductive regions 21 to 23 are provided in the conductive member 20.

In the first sample, the first counter magnetic region 11c is a $Co_{40}Fe_{40}B_{20}$ film (having a thickness of 1.9 nm). The second conductive region 22 is a $Hf_{50}B_{50}$ film (having a thickness of 1 nm). The first conductive region 21 is a W film (having a thickness of 3 nm). The third conductive region 23 is a $Hf_{50}B_{50}$ film (having a thickness of 2 nm).

In the second sample, the first counter magnetic region 11c is a $Co_{40}Fe_{40}B_{20}$ film (having a thickness of 1.85 nm). The second conductive region 22 is a $Hf_{50}B_{50}$ film (having a thickness of 1 nm). The first conductive region 21 is a W film (having a thickness of 2 nm). The third conductive region 23 is a $Hf_{50}B_{50}$ film (having a thickness of 2 nm).

In the third sample, the first counter magnetic region 11c is a $Co_{40}Fe_{40}B_{20}$ film (having a thickness of 1.8 nm). The second conductive region 22 is a $Hf_{50}B_{50}$ film (having a thickness of 1 nm). The first conductive region 21 is a W film (having a thickness of 3 nm). The third conductive region 23 is a $Hf_{50}B_{50}$ film (having a thickness of 1 nm).

In the fourth sample, the first counter magnetic region 11c is a $Co_{40}Fe_{40}B_{20}$ film (having a thickness of 1.8 nm). The second conductive region 22 is a $Hf_{50}B_{50}$ film (having a thickness of 1 nm). The first conductive region 21 is a $W_{80}B_{20}$ film (having a thickness of 2 nm). The third conductive region 23 is a $Hf_{50}B_{50}$ film (having a thickness of 1 nm).

In the fifth sample, the conductive member 20 includes the first conductive region 21 and the second conductive region 22; and the third conductive region 23 is not provided. In the fifth sample, the first counter magnetic region 11c is a $Co_{40}Fe_{40}B_{20}$ film (having a thickness of 1.5 nm). The second conductive region 22 is a $Ta_{50}B_{50}$ film (having a thickness of 3 nm). The first conductive region 21 is a Ta film (having a thickness of 1 nm).

In the sixth sample, the conductive member 20 does not include boron. In the sixth sample, the conductive member 20 includes the first conductive region 21 but does not include the second conductive region 22 and the third conductive region 23. In the sixth sample, the first counter magnetic region 11c is a $Co_{40}Fe_{40}B_{20}$ film (having a thickness of 1.25 nm). The conductive member 20 (the first conductive region 21) is a Ta film (having a thickness of 5 nm).

Figure 6:
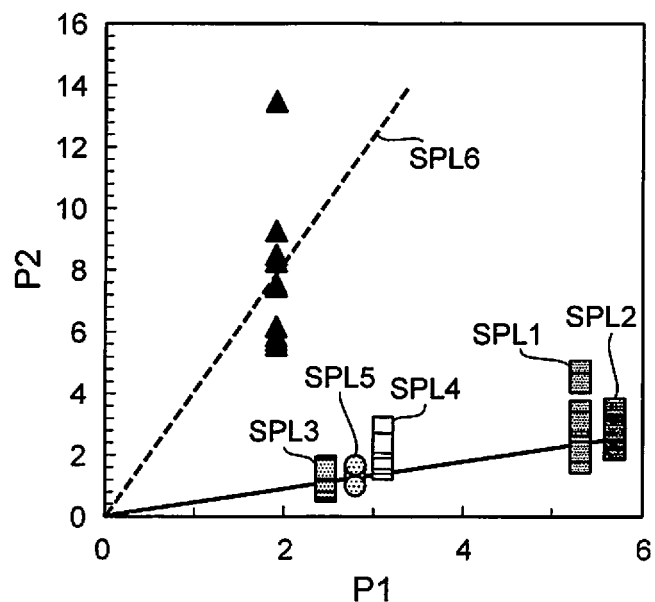
FIG. 6 is a graph illustrating a characteristic of the magnetic memory device.

FIG. 6 is a graph illustrating a characteristic of the magnetic memory device.

FIG. 6 illustrates the writing efficiency of the magnetic memory device. The horizontal axis of FIG. 6 is a first parameter P1 ($\times 10^{-4}$; arbitrary units). The first parameter P1 is ½ of the product of an effective perpendicular anisotropic magnetic field Hk_eff of the first counter magnetic region 11c and the product (Mst) of the saturation magnetization and the thickness of the first counter magnetic region 11c. The first parameter P1 corresponds to the magnetization reversal energy of the first counter magnetic layer 11c. The vertical axis of FIG. 6 is a second parameter P2 ($\times 10^{-6}$; arbitrary units) relating to the writing efficiency. The second parameter P2 is notated as "Isw/Δ." The second parameter P2 corresponds to a reversal current Isw for changing the orientation of the magnetization 11cM of the first counter magnetic region 11c per unit retention energy Δ. In FIG. 6, the writing efficiency is high when the value of the second parameter P2 (the vertical axis) is small for the same value of the first parameter P1 (the horizontal axis). The characteristics of the first to sixth samples SPL1 to SPL6 are shown in FIG. 6. The relationships between the first parameter P1 and the second parameter P2 pass through the origin of the graph of FIG. 6. In FIG. 6, the writing efficiency is high when the slope of the second parameter P2 with respect to the first parameter P1 is low.

As shown in FIG. 6, the writing efficiency of the sixth sample SPL6 is low. The writing efficiencies of the first to fifth samples SPL1 to SPL5 are high.

Thus, a high writing efficiency is obtained by the conductive member 20 including boron.

For these samples, multiple magnetic elements (the first stacked bodies SB1) are formed; and the electrical resistances of the multiple magnetic elements are evaluated. For example, a stacked film that is used to form the multiple magnetic elements is formed; and the multiple magnetic elements are obtained by patterning the stacked film. A portion of the surface portion (e.g., the second conductive region 22) of the conductive member 20 also is removed in the patterning. There are cases where the second metal included in the surface portion (the second conductive region 22) of the conductive member 20 adheres to the side surfaces of the multiple magnetic elements. The adhered matter is a compound including the second metal. The target electrical resistance of the first stacked body SB1 is obtained if the insulative properties of the adhered matter (the compound) are high. On the other hand, if the insulative properties of the adhered matter are low, for example, the electrical resistance between the conductive member 20 and the first magnetic region 11 becomes abnormally low via the adhered matter. For example, the abnormal electrical resistance is an electrical short. There are cases where the characteristics of the adhered matter affect the yield of the manufacturing processes.

For the samples recited above, the evaluation of the abnormal electrical resistance showed that the occurrence rate of the abnormal electrical resistance in the sixth sample SPL6 is high. It was found that the occurrence rate of the abnormal electrical resistance in the fifth sample SPL5 is lower than the occurrence rate of the abnormal electrical resistance in the sixth sample SPL6. It is considered that the insulative properties of the adhered matter on, for example, the side surface of the first stacked body SB1 are increased by the conductive member 20 including boron.

Also, it was found that the occurrence rates of the abnormal electrical resistance in the first to fourth samples SPL1 to SPL4 are lower than the occurrence rate of the abnormal electrical resistance in the fifth sample SPL5. For example, it is considered that the insulative properties of the adhered matter on the side surface of the first stacked body SB1 are higher when the second conductive region 22 includes Hf.

In the first to fourth samples SPL1 to SPL4, the third conductive region 23 that includes boron is provided in addition to the first conductive region 21 and the second conductive region 22. It is considered that the flatness of the third conductive region 23 is improved by its amorphous nature/structure/configuration. By providing the first conductive region 21 and the second conductive region 22 on the third conductive region 23 having good flatness, the flatness in these regions also improves. By providing the first counter magnetic region 11c on the conductive member 20 having such good flatness, the flatness of the first counter magnetic region 11c improves. By providing the first nonmagnetic region 11n on the first counter magnetic region 11c having good flatness, the first nonmagnetic region 11n that has high crystal quality is obtained. Higher magnetic properties (e.g., the MR ratio, etc.) are obtained thereby. More stable storage operations are possible thereby.

In the embodiment, the concentration of boron in at least a portion of the first counter magnetic layer 11c may be higher than the second concentration (the concentration of boron in the second conductive region 22). By setting the concentration of boron in the first counter magnetic layer 11c to be high, for example, the amorphousness in the first counter magnetic layer 11c increases; and a high writing efficiency is easier to obtain.

Figure 7:
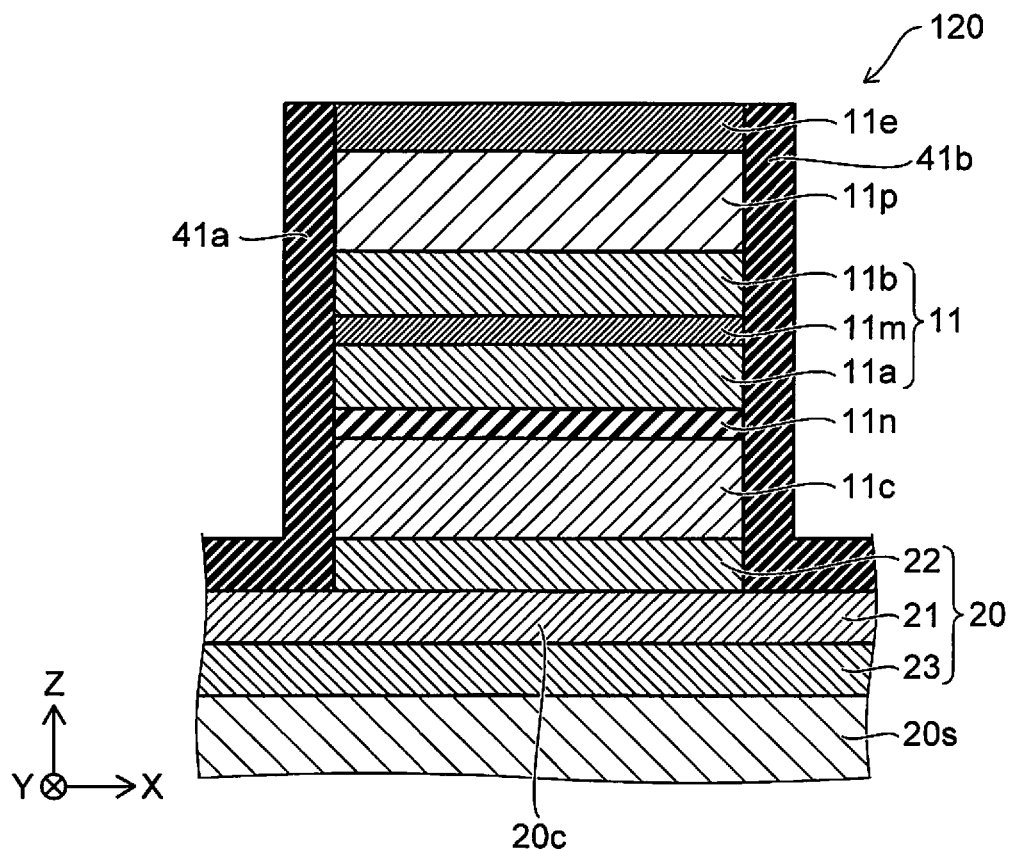
FIG. 7 is a schematic cross-sectional view illustrating the magnetic memory device according to the second embodiment.

FIG. 7 is a schematic cross-sectional view illustrating the magnetic memory device according to the second embodiment.

As shown in FIG. 7, a base body 20s may be provided at the conductive member 20. For example, the first conductive region 21 of the conductive member 20 may be provided on the base body 20s. The second conductive region 22 may be provided on the first conductive region 21. The third conductive region 23 is provided between the base body 20s and the first conductive region 21.

As shown in FIG. 7, the magnetic memory device 120 may further include a first compound region 41a. The first compound region 41a includes, for example, the second metal (e.g., the Hf, etc.) included in the second conductive region 22 and at least one selected from the group consisting of oxygen and nitrogen. The first compound region 41a includes, for example, Hf and oxygen. The first compound region 41a includes a compound including the second metal and oxygen. The first compound region 41a may further include boron (B).

The direction from the first nonmagnetic region 11n toward the first compound region 41a is aligned with the second direction (e.g., the X-axis direction). In the example, the direction from the first counter magnetic region 11c toward the first compound region 41a is aligned with the second direction (e.g., the X-axis direction). The direction from the first magnetic region 11 toward the first compound region 41a is aligned with the second direction (e.g., the X-axis direction).

The magnetic memory device 120 may further include a second compound region 41b. The second compound region 41b includes the second metal and at least one selected from the group consisting of oxygen and nitrogen. The second compound region 41b includes, for example, Hf and oxygen. The second compound region 41b includes a compound including the second metal and oxygen. The second compound region 41b may further include boron (B).

The first nonmagnetic region 11n is provided between the first compound region 41a and the second compound region 41b in the second direction (e.g., the X-axis direction). The first counter magnetic region 11c may be provided between the first compound region 41a and the second compound region 41b in the second direction (e.g., the X-axis direction). The first magnetic region 11 may be provided between the first compound region 41a and the second compound region 41b in the second direction (e.g., the X-axis direction).

For example, the magnetic memory device 120 is formed as follows. For example, the conductive member 20 is provided on the base body 20s. A film that is used to form the first counter magnetic region 11c, a film that is used to form the first nonmagnetic region 11n, and a film that is used to form the first magnetic region 11 are formed on the conductive member 20. Subsequently, these films are patterned. The first stacked body SB1 is obtained by the patterning.

The surface of the conductive member 20 is exposed by the patterning. At this time, there are cases where a portion of an element included in the second conductive region 22 of the conductive member 20 adheres to the side surface of the first stacked body SB1. The adhered matter includes a compound of the second metal (e.g., Hf) included in the second conductive region 22. The compound includes an oxide, a nitride, or an oxynitride. The compound includes the second metal. Such adhered matter corresponds to the first compound region 41a, the second compound region 41b, etc.

In the first to fourth samples SPL1 to SPL4 recited above, the adhered matter is a stable insulator. The appropriate operations of the first stacked body SB1 are maintained thereby.

The configuration described in reference to the first embodiment is applicable to the magnetic memory device 120. For example, the intermediate film 11m of the first magnetic region 11 may include Ru; and the distance tm may be not less than 1.8 nm and not more than 2.2 nm.

Third Embodiment

Figure 8:
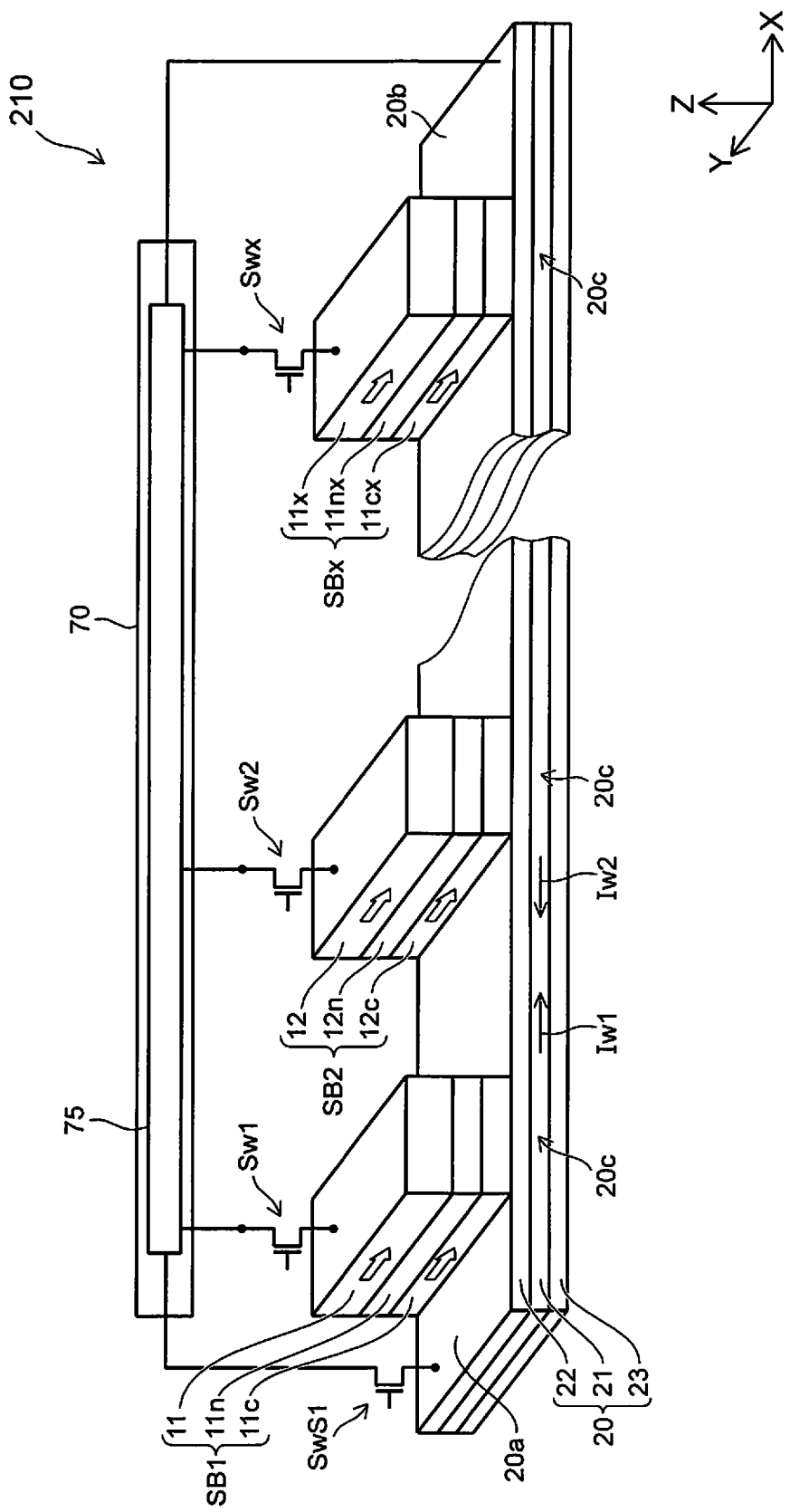
FIG. 8 is a schematic perspective view illustrating a magnetic memory device according to a third embodiment.

FIG. 8 is a schematic perspective view illustrating a magnetic memory device according to a third embodiment.

As shown in FIG. 8, multiple stacked bodies (the first stacked body SB1, the second stacked body SB2, the stacked body SBx, etc.) are provided in the magnetic memory device 210 according to the embodiment. Then, multiple switches (the switch Sw1, the switch Sw2, the switch Swx, etc.) are provided. Otherwise, the configuration of the magnetic memory device 210 is similar to that of the magnetic memory device 110 or 120.

The multiple stacked bodies are arranged along the conductive member 20. For example, the second stacked body SB2 includes a second magnetic region 12, a second counter magnetic region 12c, and a second nonmagnetic region 12n. The second magnetic region 12 is separated in the first direction (the Z-axis direction) from a portion of the conductive member 20. The second counter magnetic region 12c is provided between the second magnetic region 12 and the portion of the conductive member 20. The second nonmagnetic region 12n is provided between the second magnetic region 12 and the second counter magnetic region 12c.

For example, the second magnetic region 12 is separated from the first magnetic region 11 in the second direction (e.g., the X-axis direction). The second counter magnetic region 12c is separated from the first counter magnetic region 11c in the second direction. The second nonmagnetic region 12n is separated from the first nonmagnetic region 11n in the second direction.

For example, the stacked body SBx includes a magnetic region 11x, a counter magnetic region 11cx, and a nonmagnetic region 11nx. The magnetic region 11x is separated in the first direction (the Z-axis direction) from another portion of the conductive member 20. The counter magnetic region 11cx is provided between the magnetic region 11x and the other portion of the conductive member 20. The nonmagnetic region 11nx is provided between the magnetic region 11x and the counter magnetic region 11cx.

For example, the material and the configuration of the second magnetic region 12 are the same as the material and the configuration of the first magnetic region 11. For example, the material and the configuration of the second counter magnetic region 12c is the same as the material and the configuration of the first counter magnetic region 11c. For example, the material and the configuration of the second nonmagnetic region 12n are the same as the material and the configuration of the first nonmagnetic region 11n.

The multiple stacked bodies function as the multiple memory cells MC.

The switch Sw1 is electrically connected to the first magnetic region 11. The switch Sw2 is electrically connected to the second magnetic region 12. The switch Swx is electrically connected to the magnetic region 11x. These switches are electrically connected to the control circuit 75 of the controller 70. Any of the multiple stacked bodies is selected by these switches.

In the example of the magnetic memory device 210, the second conductive region 22 extends along the second direction (e.g., the X-axis direction). The second conductive region 22 may not be provided in regions corresponding to the regions between the multiple stacked bodies.

Fourth Embodiment

Figure 9A:
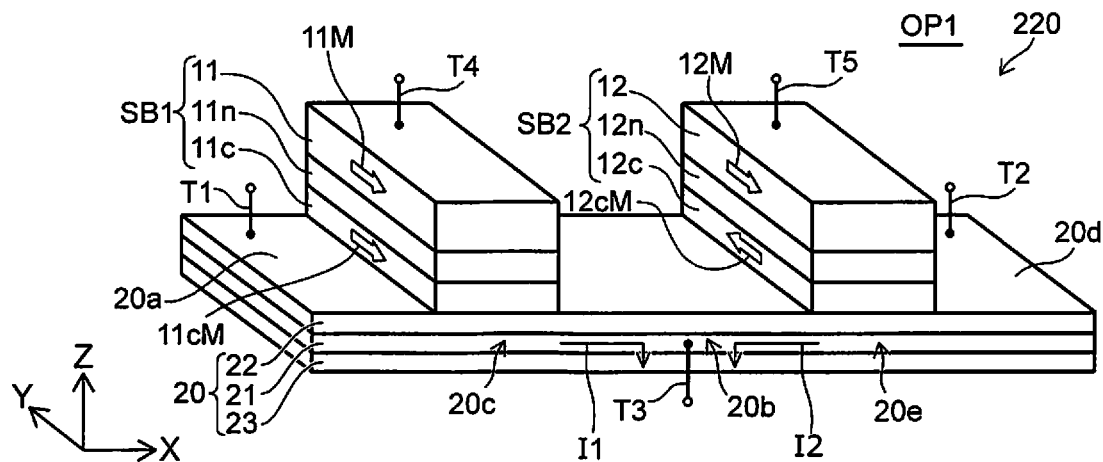
FIG. 9A to FIG. 9C are schematic perspective views illustrating a magnetic memory device according to a fourth embodiment.
Figure 9B:
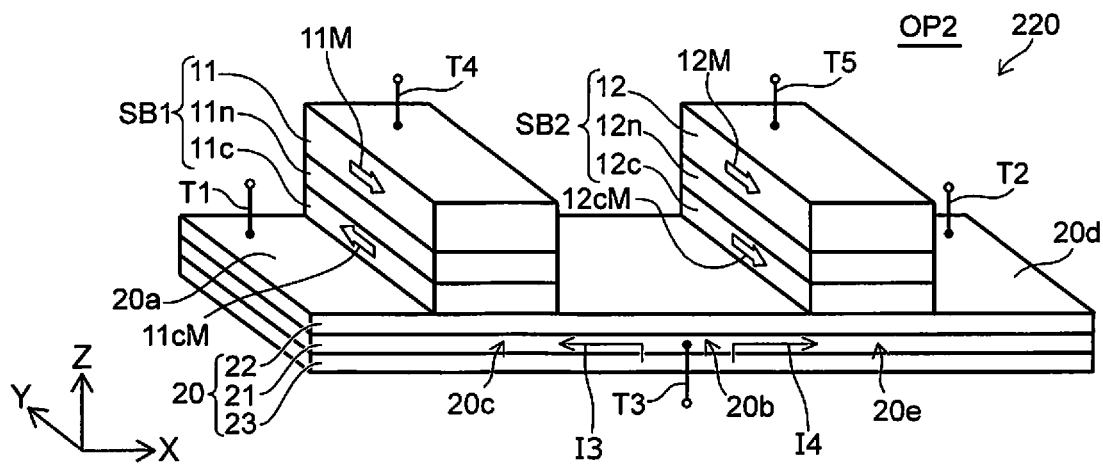
Figure 9C:
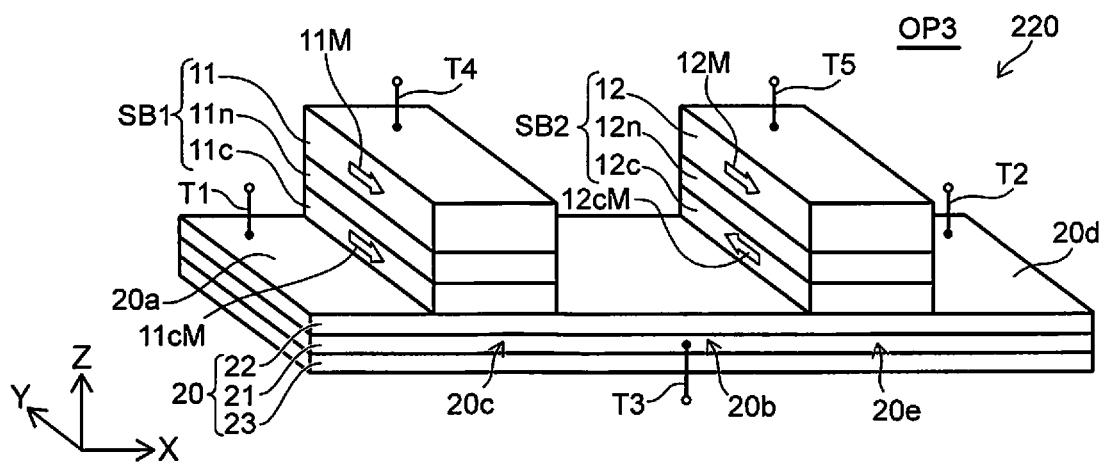

FIG. 9A to FIG. 9C are schematic perspective views illustrating a magnetic memory device according to a fourth embodiment.

As shown in FIG. 9A, the magnetic memory device 220 according to the embodiment includes the conductive member 20, the first stacked body SB1, and the second stacked body SB2. As described above, the first stacked body SB1 includes the first magnetic region 11, the first counter magnetic region 11c, and the first nonmagnetic region 11n.

The second stacked body SB2 includes the second magnetic region 12, the second counter magnetic region 12c, and the second nonmagnetic region 12n.

The conductive member 20 further includes a fourth portion 20d and a fifth portion 20e in addition to the first portion 20a, the second portion 20b, and the third portion 20c. The second portion 20b is between the third portion 20c and the fourth portion 20d in the second direction (e.g., the X-axis direction). The fifth portion 20e is between the second portion 20b and the fourth portion 20d in the second direction (e.g., the X-axis direction). The second counter magnetic region 12c is provided between the fifth portion 20e and the second magnetic region 12 in the first direction (the Z-axis direction).

In the second stacked body SB2 as well, the orientation of a magnetization 12cM of the second counter magnetic region 12c is controlled by the current flowing through the conductive member 20. On the other hand, the orientation of a magnetization 12M of the second magnetic region 12 is substantially fixed. The configuration of the second stacked body SB2 may be similar to the configuration of the first stacked body SB1.

In the example, a first terminal T1 is electrically connected to the first portion 20a. A third terminal T3 is electrically connected to the second portion 20b. A second terminal T2 is electrically connected to the fourth portion 20d. A fourth terminal T4 is electrically connected to the first magnetic region 11. A fifth terminal T5 is electrically connected to the second magnetic region 12.

The controller 70 (referring to FIG. 1B) is electrically connected to the first to fifth terminals T1 to T5.

As shown in FIG. 9A and FIG. 9B, for example, the controller 70 performs a first operation OP1 and a second operation OP2.

In the first operation OP1 as shown in FIG. 9A, the controller 70 supplies a first current I1 from the first terminal T1 toward the third terminal T3 and supplies a second current I2 from the second terminal T2 toward the third terminal T3.

In the second operation OP2 as shown in FIG. 9B, the controller 70 supplies a third current I3 from the third terminal T3 toward the first terminal T1 and supplies a fourth current I4 from the third terminal T3 toward the second terminal T2.

One resistance state is obtained in the set of the two magnetic elements (the two stacked bodies) by the first operation OP1. Another one resistance state is obtained in the set of the two magnetic elements by the second operation OP2. For example, the first operation OP1 corresponds to a write operation of one of "1" or "0." For example, the second operation OP2 corresponds to the write operation of the other of "1" or "0."

In a third operation OP3 as shown in FIG. 9C, the controller 70 applies a voltage between the fourth terminal T4 and the fifth terminal T5 (between the first magnetic region 11 and the second magnetic region 12) and detects the potential of the third terminal T3 (the second portion 20b). The potential of the third terminal T3 (the second portion 20b) is different between the multiple resistance states. The multiple resistance states (the multiple memory states) can be detected by detecting the potential of the third terminal T3 (the second portion 20b).

For example, the energy consumed when reading in the third operation OP3 recited above can be lower than that of the case where a constant current is supplied to the stacked body (the magnetoresistive element) and the voltage (the potential difference) between the two magnetic regions of the magnetoresistive element is measured. In the third operation OP3 recited above, for example, high-speed reading can be performed.

Fifth Embodiment

Figure 10:
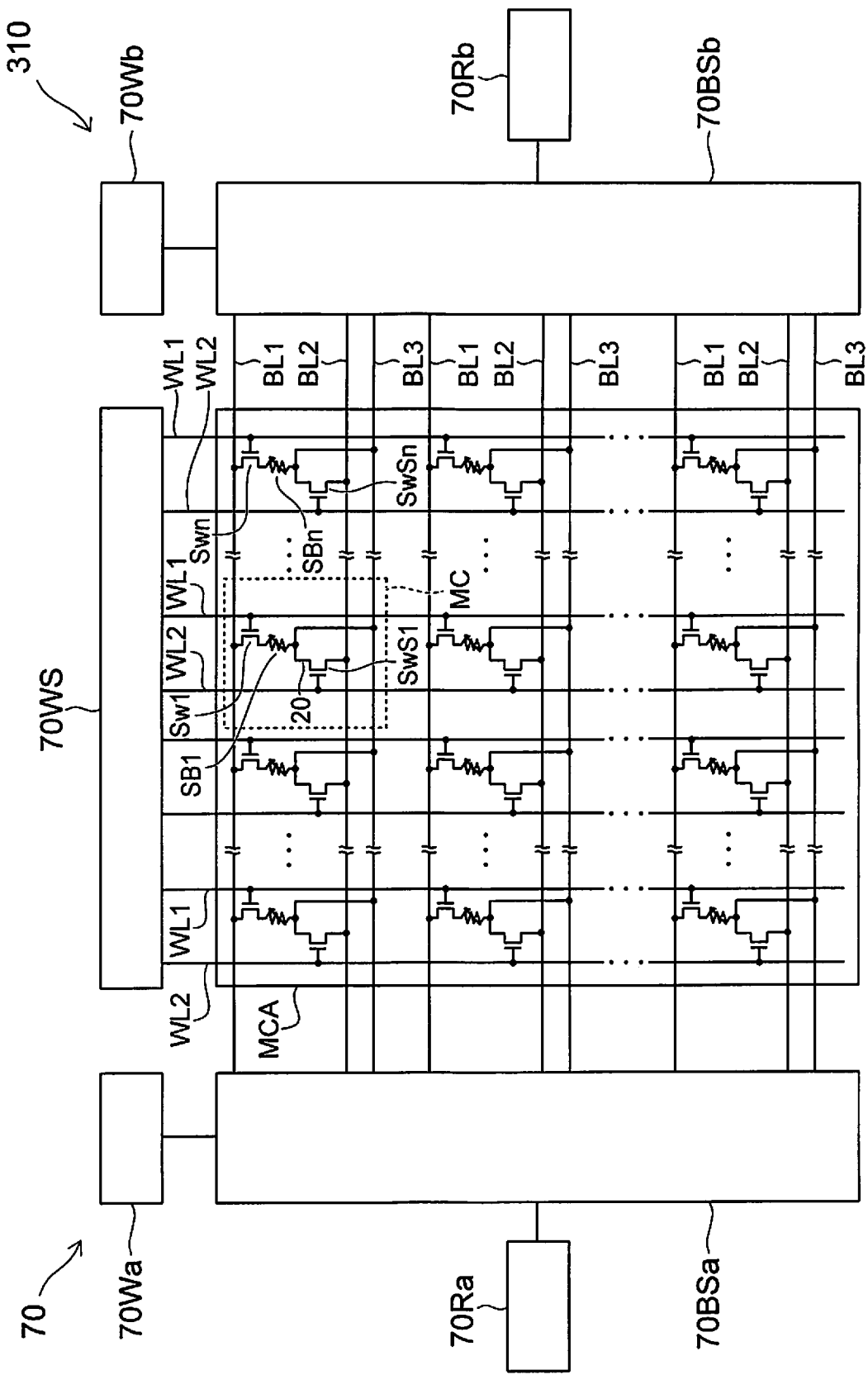
FIG. 10 is a schematic view showing a magnetic memory device according to a fifth embodiment.

FIG. 10 is a schematic view showing a magnetic memory device according to a fifth embodiment.

As shown in FIG. 10, a memory cell array MCA, multiple first interconnects (e.g., word lines WL1, WL2, etc.), multiple second interconnects (e.g., bit lines BL1, BL2, BL3, etc.), and the controller 70 are provided in the magnetic memory device 310 according to the embodiment. The multiple first interconnects extend in one direction. The multiple second interconnects extend in another one direction. The controller 70 includes a word line selection circuit 70WS, a first bit line selection circuit 70BSa, a second bit line selection circuit 70BSb, a first write circuit 70Wa, a second write circuit 70Wb, a first read circuit 70Ra, and a second read circuit 70Rb. Multiple memory cells MC are arranged in an array configuration in the memory cell array MCA.

For example, the switch Sw1 and the switch SwS1 are provided to correspond to one of the multiple memory cells MC. These switches may be considered to be included in one of the multiple memory cells MC. These switches may be considered to be included in the controller 70. These switches are, for example, transistors. The one of the multiple memory cells MC includes, for example, a stacked body (e.g., the first stacked body SB1).

As described in reference to FIG. 8, multiple stacked bodies (the first stacked body SB1, the second stacked body SB2, the stacked body SBx, etc.) may be provided at one conductive member 20. Multiple switches (the switch Sw1, the switch Sw2, the switch Swx, etc.) may be provided respectively for the multiple stacked bodies. In FIG. 10 one stacked body (the stacked body SB1 or the like) and one switch (the switch Sw1 or the like) are drawn to correspond to one conductive member 20 for easier viewing of the drawing.

As shown in FIG. 10, one end of the first stacked body SB1 is connected to the conductive member 20. The other end of the first stacked body SB1 is connected to one of the source or the drain of the switch Sw1. The other of the source or the drain of the switch Sw1 is connected to the bit line BL1. The gate of the switch Sw1 is connected to the word line WL1. One end (e.g., the first portion 20a) of the conductive member 20 is connected to one of the source or the drain of the switch SwS1. The other end (e.g., the second portion 20b) of the conductive member 20 is connected to the bit line BL3. The other of the source or the drain of the switch SwS1 is connected to the bit line BL2. The gate of the switch SwS1 is connected to the word line WL2.

A stacked body SBn, a switch Swn, and a switch SwSn are provided for another one of the multiple memory cells MC.

An example of the write operation of the information to the memory cell MC will now be described.

The switch SwS1 of one memory cell MC (the selected memory cell) to which the writing is to be performed is set to the ON-state. For example, the ON-state is formed by setting, to a high-level potential, the word line WL2 connected to the gate of the one switch SwS1. The setting of the potential is performed by the word line selection circuit 70WS. The switch SwS1 of another memory cell MC (an unselected memory cell) of the column including the one memory cell MC (the selected memory cell) recited above also is set to the ON-state. The word line WL1 that is connected to the gate of the switch SwS1 inside the memory cell MC (the selected memory cell) and the word lines WL1 and WL2 that correspond to the other columns are set to a low-level potential.

The bit lines BL2 and BL3 that are connected to the memory cell MC (the selected cell) to which the writing is to be performed are selected. The selection is performed by the first bit line selection circuit 70BSa and the second bit line selection circuit 70BSb. The write current is supplied to the selected bit lines BL2 and BL3. The supply of the write current is performed by the first write circuit 70Wa and the second write circuit 70Wb. The write current flows from one of the first bit line selection circuit 70BSa or the second bit line selection circuit 70BSb toward the other of the first bit line selection circuit 70BSa or the second bit line selection circuit 70BSb. The magnetization direction of the memory layer (the second magnetic region 12 or the like) of the MTJ element (the first stacked body SB1 or the like) is changeable by the write current. The magnetization direction of the memory layer of the MTJ element is changeable to the reverse direction of that recited above when the write current flows toward one of the first bit line selection circuit 70BSa or the second bit line selection circuit 70BSb from the other of the first bit line selection circuit 70BSa or the second bit line selection circuit 70BSb. Thus, the writing is performed.

An example of the read operation of the information from the memory cell MC will now be described.

The word line WL1 that is connected to the memory cell MC (the selected cell) from which the reading is to be performed is set to the high-level potential. The switch Sw1 inside the memory cell MC (the selected cell) recited above is set to the ON-state. At this time, the switches Sw1 of the other memory cells MC (the unselected cells) of the column including the memory cell MC (the selected cell) recited above also are set to the ON-state. The word line WL2 that is connected to the gate of the switch SwS1 inside the memory cell MC (the selected cell) recited above and the word lines WL1 and WL2 that correspond to the other columns are set to the low-level potential.

The bit lines BL1 and BL3 that are connected to the memory cell MC (the selected cell) from which the reading is to be performed are selected. The selection is performed by the first bit line selection circuit 70BSa and the second bit line selection circuit 70BSb. The read current is supplied to the selected bit line BL1 and bit line BL3. The supply of the read current is performed by the first read circuit 70Ra and the second read circuit 70Rb. The read current flows from one of the first bit line selection circuit 70BSa or the second bit line selection circuit 70BSb toward the other of the first bit line selection circuit 70BSa or the second bit line selection circuit 70BSb. For example, the voltage between the selected bit lines BL1 and BL3 recited above is detected by the first read circuit 70Ra and the second read circuit 70Rb. For example, the difference between the magnetization of the memory layer (the second magnetic region 12) and the magnetization of the reference layer (the first magnetic region 11) of the MTJ element is detected. The difference includes the orientations of the magnetizations being in a mutually-parallel state (having the same orientation) or a mutually-antiparallel state (having the reverse orientation). Thus, the read operation is performed.

The embodiments may include, for example, the following configurations (e.g., technological proposals).

Configuration 1

A magnetic memory device, comprising:
a first magnetic region;
a first counter magnetic region; and
a first nonmagnetic region provided between the first magnetic region and the first counter magnetic region,
the first magnetic region including a first magnetic film, a second magnetic film, and an intermediate film,
the first magnetic film being provided between the second magnetic film and the first nonmagnetic region,
the intermediate film including Ru and being provided between the first magnetic film and the second magnetic film, a distance along a first direction between the first magnetic film and the second magnetic film being not less than 1.8 nm and not more than 2.2 nm, the first direction being from the first counter magnetic region toward the first magnetic region.

Configuration 2

The magnetic memory device according to Configuration 1, wherein the first magnetic film is antiferromagnetically coupled to the second magnetic film.

Configuration 3
The magnetic memory device according to Configuration 1 or 2, wherein at least one of an easy magnetization axis of the first magnetic film or an easy magnetization axis of the second magnetic film crosses the first direction.

Configuration 4
The magnetic memory device according to any one of Configurations 1 to 3, wherein at least one of the first magnetic film or the second magnetic film includes at least one selected from the group consisting of Fe and Co.

Configuration 5
The magnetic memory device according to Configuration 4, wherein the at least one of the first magnetic film or the second magnetic film further includes B.

Configuration 6
The magnetic memory device according to any one of Configurations 1 to 3, wherein at least one of the first magnetic film or the second magnetic film has a body-centered cubic structure or an amorphous structure.

Configuration 7
The magnetic memory device according to any one of Configurations 1 to 6, wherein the first magnetic film includes Mn.

Configuration 8
The magnetic memory device according to any one of Configurations 1 to 7, wherein the intermediate film includes Mn.

Configuration 9
The magnetic memory device according to any one of Configurations 1 to 8, wherein the second magnetic film includes Mn.

Configuration 10
The magnetic memory device according to any one of Configurations 1 to 9, further comprising a magnetic portion,
the second magnetic film being provided between the intermediate film and the magnetic portion,
the magnetic portion including Mn and at least one selected from the group consisting of Ir and Pt.

Configuration 11
The magnetic memory device according to Configuration 10, wherein in energy dispersive X-ray spectrometry, a concentration of Mn in the second magnetic film is not less than 0.1 times a concentration of Mn in the magnetic portion.

Configuration 12
The magnetic memory device according to Configuration 10, wherein in energy dispersive X-ray spectrometry, a concentration of Mn in the intermediate film is not less than 0.1 times a concentration of Mn in the magnetic portion.

Configuration 13
The magnetic memory device according to any one of Configurations 1 to 12, wherein a length of the first magnetic region along a second direction crossing the first direction is not less than 10 nm and not more than 30 nm.

Configuration 14
The magnetic memory device according to Configuration 13, wherein a length of the first magnetic region along a third direction is not less than 10 nm and not more than 50 nm, the third direction crossing a plane including the first direction and the second direction.

Configuration 15
The magnetic memory device according to any one of Configurations 1 to 14, wherein the first counter magnetic region includes at least one selected from the group consisting of Fe and Co.

Configuration 16
The magnetic memory device according to Configuration 15, wherein the first counter magnetic region further includes B.

Configuration 17
The magnetic memory device according to any one of Configurations 1 to 16, further comprising a conductive member,
the conductive member including a first portion, a second portion, and a third portion between the first portion and the second portion,
a second direction from the first portion toward the second portion crossing the first direction,
the first counter magnetic region being positioned between the third portion and the first magnetic region in the first direction.

Configuration 18
The magnetic memory device according to Configuration 17, further comprising a controller,
the controller being electrically connected to the first portion and the second portion,
the controller is configured to perform at least:
a first operation of supplying a first current to the conductive member from the first portion toward the second portion; and
a second operation of supplying a second current to the conductive member from the second portion toward the first portion.

Configuration 19
The magnetic memory device according to Configuration 18, wherein
the controller is electrically connected also to the first magnetic region,
the controller is configured to further perform at least a third operation and a fourth operation,
in the first operation, the controller is configured to set a potential difference between the first portion and the first magnetic region to a first voltage,
in the second operation, the controller is configured to set the potential difference between the first portion and the first magnetic region to the first voltage,
in the third operation, the controller is configured to set the potential difference between the first portion and the first magnetic region to a second voltage and supplies the first current to the conductive member,
in the fourth operation, the controller is configured to set the potential difference between the first portion and the first magnetic region to the second voltage and supplies the second current to the conductive member,
the first voltage is different from the second voltage,
a first electrical resistance between the first magnetic region and the first portion after the first operation is different from a second electrical resistance between the first magnetic region and the first portion after the second operation, and
an absolute value of a difference between the first electrical resistance and the second electrical resistance is greater than an absolute value of a difference between a third electrical resistance and a fourth electrical resistance, the third electrical resistance being between the first magnetic region and the first portion after the third operation, the fourth electrical resistance being between the first magnetic region and the first portion after the fourth operation.

Configuration 20
The magnetic memory device according to Configuration 17, further comprising:
a second magnetic region;
a second counter magnetic region;

a second nonmagnetic region; and
a controller,
the conductive member further including a fourth portion and a fifth portion,
the second portion being between the third portion and the fourth portion in the second direction,
the fifth portion being between the second portion and the fourth portion in the second direction,
the second counter magnetic region being provided between the fifth portion and the second magnetic region in the first direction,
the second nonmagnetic region being provided between the second magnetic region and the second counter magnetic region,
the controller being electrically connected also to the first portion, the second portion, the fourth portion, the first magnetic region, and the second magnetic region,
in a first operation, the controller being configured to supply a first current from the first portion toward the second portion and supplying a second current from the fourth portion toward the second portion,
in a second operation, the controller being configured to supply a third current from the second portion toward the first portion and supplying a fourth current from the second portion toward the fourth portion.

Configuration 21
The magnetic memory device according to Configuration 20, wherein in a third operation, the controller is configured to apply a voltage between the first magnetic region and the second magnetic region and detects a potential of the second portion.

Configuration 22
The magnetic memory device according to Configuration 1, wherein the first magnetic region undergoes heat treatment at a temperature greater than 350° C.

Configuration 23
A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first portion toward the second portion; and
a first nonmagnetic layer provided between the first magnetic layer and the first counter magnetic layer,
the third portion including a first conductive region, a second conductive region, and a third conductive region,
the second conductive region being between the third conductive region and the first counter magnetic layer in the first direction,
the first conductive region being between the second conductive region and the third conductive region in the first direction,
a first concentration of boron in the first conductive region being not more than a second concentration of boron in the second conductive region and lower than a third concentration of boron in the third conductive region.

Configuration 24
The magnetic memory device according to Configuration 23, wherein a concentration of boron in at least a portion of the first counter magnetic layer is higher than the second concentration.

Configuration 25
The magnetic memory device according to Configuration 23 or 24, further comprising a first compound region,
the second conductive region including a second metal,
the first compound region including the second metal and at least one selected from the group consisting of oxygen and nitrogen,
a direction from the first nonmagnetic layer toward the first compound region being aligned with the second direction.

Configuration 26
The magnetic memory device according to Configuration 25, further comprising a second compound region including the second metal and at least one selected from the group consisting of oxygen and nitrogen,
the first nonmagnetic layer being provided between the first compound region and the second compound region in the second direction.

Configuration 27
The magnetic memory device according to Configuration 25 or 26, wherein the second metal includes Hf.

Configuration 28
The magnetic memory device according to any one of Configurations 23 to 27, wherein
the first conductive region includes a first metal, and
the first metal includes at least one selected from the group consisting of Hf, Ta, W, Re, Os, Ir, Pt, Au, Bi, Cu, Ag, and Pd.

Configuration 29
The magnetic memory device according to Configurations 23, 24, or 28, wherein
the second conductive region includes a second metal and boron, and
the second metal includes at least one selected from the group consisting of Hf, Ta, W, Re, Os, Ir, Pt, Au, Bi, Cu, Ag, and Pd.

Configuration 30
The magnetic memory device according to Configurations 23, 24, 28, or 29, wherein
the third conductive region includes a third metal and boron, and
the third metal includes at least one selected from the group consisting of Hf, Ta, W, Re, Os, Ir, Pt, Au, Bi, Cu, Ag, and Pd.

Configuration 31
The magnetic memory device according to any one of Configurations 23 to 30, further comprising a controller,
the controller being electrically connected to the first portion and the second portion,
the controller being configured to perform at least:
a first operation of supplying a first current to the conductive member from the first portion toward the second portion; and
a second operation of supplying a second current to the conductive member from the second portion toward the first portion.

Configuration 32
The magnetic memory device according to Configuration 31, wherein
the controller is electrically connected also to the first magnetic region,
the controller is configured to further perform at least a third operation and a fourth operation,
in the first operation, the controller is configured to set a potential difference between the first portion and the first magnetic region to a first voltage,
in the second operation, the controller is configured to set the potential difference between the first portion and the first magnetic region to the first voltage, in the third operation, the controller is configured to set the potential difference between the first portion and the first magnetic region to a second voltage and supplies the first current to the conductive member, in the fourth operation, the controller is configured to set the potential difference between the first portion and the first magnetic region to the second voltage and supplies the second current to the conductive member, the first voltage is different from the second voltage, a first electrical resistance between the first magnetic region and the first portion after the first operation is different from a second electrical resistance between the first magnetic region and the first portion after the second operation, and an absolute value of a difference between the first electrical resistance and the second electrical resistance is greater than an absolute value of a difference between a third electrical resistance and a fourth electrical resistance, the third electrical resistance being between the first magnetic region and the first portion after the third operation, the fourth electrical resistance being between the first magnetic region and the first portion after the fourth operation.

Configuration 33

The magnetic memory device according to any one of Configurations 23 to 30, further comprising:
a second magnetic region;
a second counter magnetic region;
a second nonmagnetic region; and
a controller,
the conductive member further including a fourth portion and a fifth portion,
the second portion being between the third portion and the fourth portion in the second direction,
the fifth portion being between the second portion and the fourth portion in the second direction,
the second counter magnetic region being provided between the fifth portion and the second magnetic region in the first direction,
the second nonmagnetic region being provided between the second magnetic region and the second counter magnetic region,
the controller being electrically connected also to the first portion, the second portion, the fourth portion, the first magnetic region, and the second magnetic region,
in a first operation, the controller being configured to supply a first current from the first portion toward the second portion and supplying a second current from the fourth portion toward the second portion,
in a second operation, the controller being configured to supply a third current from the second portion toward the first portion and supplying a fourth current from the second portion toward the fourth portion.

Configuration 34

The magnetic memory device according to Configuration 33, wherein in a third operation, the controller is configured to apply a voltage between the first magnetic region and the second magnetic region and detects a potential of the second portion.

According to the embodiments, a magnetic memory device can be provided in which stable operations are possible.

In the specification of the application, "perpendicular" and "parallel" refer to not only strictly perpendicular and strictly parallel but also include, for example, the fluctuation due to manufacturing processes, etc. It is sufficient to be substantially perpendicular and substantially parallel.

Hereinabove, exemplary embodiments of the invention are described with reference to specific examples. However, the embodiments of the invention are not limited to these specific examples. For example, one skilled in the art may similarly practice the invention by appropriately selecting specific configurations of components included in magnetic memory memory devices such as magnetic regions, nonmagnetic regions, conductive members, controllers, etc., from known art. Such practice is included in the scope of the invention to the extent that similar effects thereto are obtained.

Further, any two or more components of the specific examples may be combined within the extent of technical feasibility and are included in the scope of the invention to the extent that the purport of the invention is included.

Moreover, all magnetic memory devices practicable by an appropriate design modification by one skilled in the art based on the magnetic memory devices described above as embodiments of the invention also are within the scope of the invention to the extent that the spirit of the invention is included.

Various other variations and modifications can be conceived by those skilled in the art within the spirit of the invention, and it is understood that such variations and modifications are also encompassed within the scope of the invention.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the invention.

What is claimed is:

1. A magnetic memory device, comprising:
   a first magnetic region;
   a first counter magnetic region; and
   a first nonmagnetic region provided between the first magnetic region and the first counter magnetic region,
   the first magnetic region including a first magnetic film, a second magnetic film, and an intermediate film,
   the first magnetic film being provided between the second magnetic film and the first nonmagnetic region,
   the intermediate film including Ru and being provided between the first magnetic film and the second magnetic film,
   a distance along a first direction between the first magnetic film and the second magnetic film being not less than 1.8 nm and not more than 2.2 nm, the first direction being from the first counter magnetic region toward the first magnetic region.

2. The magnetic memory device according to claim 1, wherein the first magnetic film includes Mn.

3. The magnetic memory device according to claim 1, wherein the intermediate film includes Mn.

4. The magnetic memory device according to claim 1, wherein the second magnetic film includes Mn.

5. The magnetic memory device according to claim 1, further comprising a magnetic portion,
   the second magnetic film being provided between the intermediate film and the magnetic portion,
   the magnetic portion including Mn and at least one selected from the group consisting of Ir and Pt, in energy dispersive X-ray spectrometry, a concentration of Mn in the second magnetic film being not less than 0.1 times a concentration of Mn in the magnetic portion.

6. The magnetic memory device according to claim 1, further comprising a magnetic portion,
the second magnetic film being provided between the intermediate film and the magnetic portion,
the magnetic portion including Mn and at least one selected from the group consisting of Ir and Pt,
in energy dispersive X-ray spectrometry, a concentration of Mn in the intermediate film being not less than 0.1 times a concentration of Mn in the magnetic portion.

7. The magnetic memory device according to claim 1, further comprising
a conductive member; and
a controller,
the conductive member including a first portion, a second portion, and a third portion between the first portion and the second portion,
a second direction from the first portion toward the second portion crossing the first direction,
the first counter magnetic region being positioned between the third portion and the first magnetic region in the first direction,
the controller being electrically connected to the first portion and the second portion,
the controller is configured to perform at least:
a first operation of supplying a first current to the conductive member from the first portion toward the second portion; and
a second operation of supplying a second current to the conductive member from the second portion toward the first portion.

8. A magnetic memory device, comprising:
a conductive member including a first portion, a second portion, and a third portion between the first portion and the second portion;
a first magnetic layer;
a first counter magnetic layer provided between the third portion and the first magnetic layer in a first direction crossing a second direction, the second direction being from the first portion toward the second portion; and
a first nonmagnetic layer provided between the first magnetic layer and the first counter magnetic layer,
the third portion including a first conductive region, a second conductive region, and a third conductive region,
the second conductive region being between the third conductive region and the first counter magnetic layer in the first direction,
the first conductive region being between the second conductive region and the third conductive region in the first direction,
a first concentration of boron in the first conductive region being not more than a second concentration of boron in the second conductive region and lower than a third concentration of boron in the third conductive region.

9. The magnetic memory device according to claim 8, wherein a concentration of boron in at least a portion of the first counter magnetic layer is higher than the second concentration.

10. The magnetic memory device according to claim 8, further comprising a first compound region,
the second conductive region including a second metal,
the first compound region including the second metal and at least one selected from the group consisting of oxygen and nitrogen,
a direction from the first nonmagnetic layer toward the first compound region being aligned with the second direction.

11. The magnetic memory device according to claim 10, further comprising a second compound region including the second metal and at least one selected from the group consisting of oxygen and nitrogen,
the first nonmagnetic layer being provided between the first compound region and the second compound region in the second direction.

12. The magnetic memory device according to claim 10, wherein the second metal includes Hf.

13. The magnetic memory device according to claim 8, wherein
the first conductive region includes a first metal, and
the first metal includes at least one selected from the group consisting of Hf, Ta, W, Re, Os, Ir, Pt, Au, Bi, Cu, Ag, and Pd.

14. The magnetic memory device according to claim 8, wherein
the second conductive region includes a second metal and boron, and
the second metal includes at least one selected from the group consisting of Hf, Ta, W, Re, Os, Ir, Pt, Au, Bi, Cu, Ag, and Pd.

15. The magnetic memory device according to claim 8, wherein
the third conductive region includes a third metal and boron, and
the third metal includes at least one selected from the group consisting of Hf, Ta, W, Re, Os, Ir, Pt, Au, Bi, Cu, Ag, and Pd.

16. The magnetic memory device according to claim 8, further comprising a controller,
the controller being electrically connected to the first portion and the second portion,
the controller being configured to perform at least:
a first operation of supplying a first current to the conductive member from the first portion toward the second portion; and
a second operation of supplying a second current to the conductive member from the second portion toward the first portion.

17. The magnetic memory device according to claim 16, wherein
the controller is electrically connected also to the first magnetic region,
the controller is configured to further perform at least a third operation and a fourth operation,
in the first operation, the controller is configured to set a potential difference between the first portion and the first magnetic region to a first voltage,
in the second operation, the controller is configured to set the potential difference between the first portion and the first magnetic region to the first voltage,
in the third operation, the controller is configured to set the potential difference between the first portion and the first magnetic region to a second voltage and supplies the first current to the conductive member,
in the fourth operation, the controller is configured to set the potential difference between the first portion and the first magnetic region to the second voltage and supplies the second current to the conductive member, the first voltage is different from the second voltage,
a first electrical resistance between the first magnetic region and the first portion after the first operation is different from a second electrical resistance between the first magnetic region and the first portion after the second operation, and
an absolute value of a difference between the first electrical resistance and the second electrical resistance is greater than an absolute value of a difference between a third electrical resistance and a fourth electrical resistance, the third electrical resistance being between the first magnetic region and the first portion after the third operation, the fourth electrical resistance being between the first magnetic region and the first portion after the fourth operation.

18. The magnetic memory device according to claim 8, further comprising:
a second magnetic region;
a second counter magnetic region;
a second nonmagnetic region; and
a controller,
the conductive member further including a fourth portion and a fifth portion,
the second portion being between the third portion and the fourth portion in the second direction,
the fifth portion being between the second portion and the fourth portion in the second direction,
the second counter magnetic region being provided between the fifth portion and the second magnetic region in the first direction,
the second nonmagnetic region being provided between the second magnetic region and the second counter magnetic region,
the controller being electrically connected also to the first portion, the second portion, the fourth portion, the first magnetic region, and the second magnetic region,
in a first operation, the controller being configured to supply a first current from the first portion toward the second portion and supplying a second current from the fourth portion toward the second portion,
in a second operation, the controller being configured to supply a third current from the second portion toward the first portion and supplying a fourth current from the second portion toward the fourth portion.

19. The magnetic memory device according to claim 18, wherein in a third operation, the controller is configured to apply a voltage between the first magnetic region and the second magnetic region and detects a potential of the second portion.

20. The magnetic memory device according to claim 8, wherein at least a part of the third conductive region is amorphous.

* * * * *